(12) United States Patent
Kobayashi

(10) Patent No.: US 12,368,974 B2
(45) Date of Patent: Jul. 22, 2025

(54) PHOTOELECTRIC CONVERSION DEVICE AND PHOTOELECTRIC CONVERSION SYSTEM

(71) Applicant: CANON KABUSHIKI KAISHA, Tokyo (JP)

(72) Inventor: Daisuke Kobayashi, Saitama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 18/432,889

(22) Filed: Feb. 5, 2024

(65) Prior Publication Data

US 2024/0179427 A1 May 30, 2024

Related U.S. Application Data

(63) Continuation of application No. 18/309,372, filed on Apr. 28, 2023, now Pat. No. 11,930,284, which is a continuation of application No. 17/586,520, filed on Jan. 27, 2022, now Pat. No. 11,678,080.

(30) Foreign Application Priority Data

Feb. 4, 2021 (JP) ................................ 2021-016452

(51) Int. Cl.
| | |
|---|---|
| H04N 25/57 | (2023.01) |
| G01C 3/08 | (2006.01) |
| G06N 3/08 | (2023.01) |
| H04N 25/76 | (2023.01) |
| H04N 25/778 | (2023.01) |
| H04N 25/78 | (2023.01) |
| H04N 25/79 | (2023.01) |
| H10F 39/00 | (2025.01) |

(52) U.S. Cl.
CPC ............... *H04N 25/57* (2023.01); *G01C 3/08* (2013.01); *G06N 3/08* (2013.01); *H04N 25/778* (2023.01); *H04N 25/7795* (2023.01); *H04N 25/78* (2023.01); *H04N 25/79* (2023.01); *H10F 39/809* (2025.01)

(58) Field of Classification Search
None
See application file for complete search history.

(56) References Cited

U.S. PATENT DOCUMENTS 11,930,284 B2 * 3/2024 Kobayashi ............. H04N 25/78

* cited by examiner

*Primary Examiner* — Mark T Monk
(74) *Attorney, Agent, or Firm* — Canon U.S.A., Inc. IP Division

(57) ABSTRACT

A photoelectric conversion device according to one embodiment includes: a first substrate including a pixel that includes a photoelectric conversion element; and a second substrate including a first control unit that includes a first signal processing unit configured to process a signal from the pixel, the second substrate being stacked together with the first substrate. The signal from the pixel is output to a second signal processing unit disposed at a position different from a position of the first signal processing unit, a path through which the signal from the pixel is output to the first signal processing unit is different from a path through which the signal from the pixel is output to the second signal processing unit, and the first control unit is configured to control the pixel on the basis of the signal processed by the first signal processing unit.

42 Claims, 14 Drawing Sheets

PHOTOELECTRIC CONVERSION DEVICE AND PHOTOELECTRIC CONVERSION SYSTEM

CROSS-REFERENCE TO RELATED APPLICATION

This application is a Continuation of U.S. application Ser. No. 18/309,372, filed Apr. 28, 2023; which is a Continuation of U.S. application Ser. No. 17/586,520, filed Jan. 27, 2022, now U.S. patent Ser. No. 11/678,080, issued Jun. 13, 2023; which claims priority from Japanese Patent Application No. 2021-016452 filed Feb. 4, 2021, which is hereby incorporated by reference herein in its entirety.

BACKGROUND

Field of the Disclosure

The disclosure relates to a photoelectric conversion device and a photoelectric conversion system.

Description of the Related Art

There has been a demand for increasing, for example, functionality of photoelectric conversion devices. For example, there has been a demand for, for example, attaining a higher dynamic range and enabling detection of high-speed mobile bodies to thereby increase added values of photoelectric conversion devices.

Japanese Patent Laid-Open No. 2016-171455 describes an image sensor in which a first substrate and a second substrate are stacked. Japanese Patent Laid-Open No. 2016-171455 discloses a configuration in which pixels are disposed on the first substrate and a read circuit for processing pixel signals from the first substrate and a control circuit are disposed on the second substrate. Japanese Patent Laid-Open No. 2016-171455 discloses a configuration in which the control circuit receives the result of processing by the read circuit and controls the pixels for each pixel group on the basis of the result of processing by the read circuit.

SUMMARY OF THE DISCLOSURE

The disclosure provides a photoelectric conversion device including: a first substrate including a pixel that includes a photoelectric conversion element; and a second substrate including a first control unit that includes a first signal processing unit configured to process a signal from the pixel, the second substrate being stacked together with the first substrate. The signal from the pixel is output to a second signal processing unit disposed at a position different from a position of the first signal processing unit, a path through which the signal from the pixel is output to the first signal processing unit is different from a path through which the signal from the pixel is output to the second signal processing unit, and the first control unit is configured to control the pixel on the basis of the signal processed by the first signal processing unit.

Further features of the disclosure will become apparent from the following description of exemplary embodiments with reference to the attached drawings.

DESCRIPTION OF THE EMBODIMENTS

Figure 1:
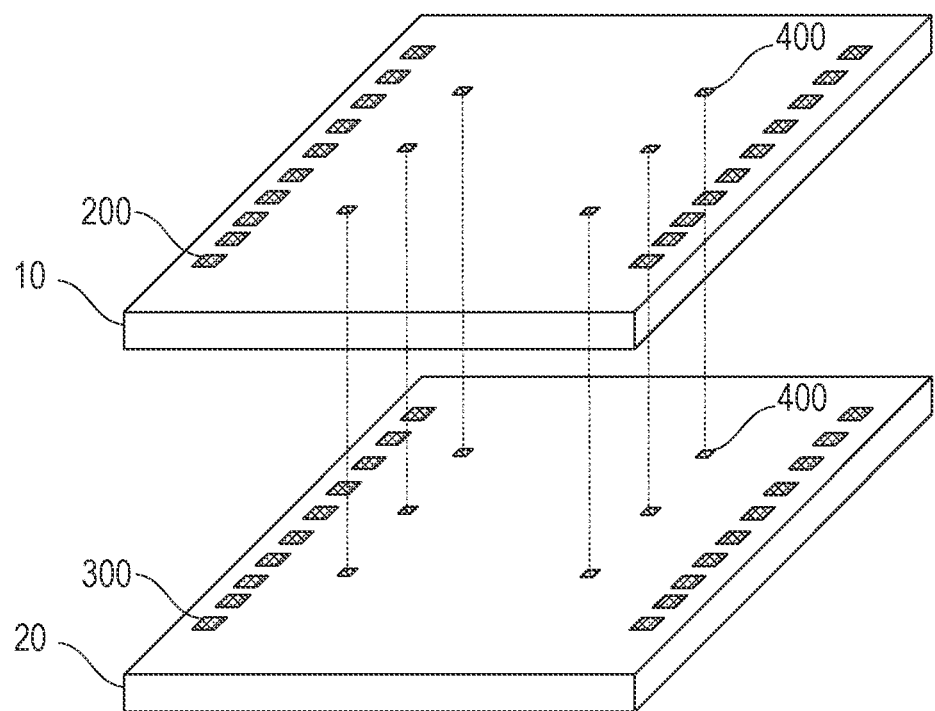
FIG. 1 is a schematic perspective view of a photoelectric conversion device according to a first embodiment.

A control signal to be generated based on the result of processing of a pixel signal is to be generated in a short time depending on the use. For example, for an object for which the brightness changes or an object that moves at a speed higher than or equal to a predetermined speed, a generated control signal might not be appropriate due to a delay caused by the time taken to generate the control signal. Therefore, the control signal is to be generated at an increased speed. Meanwhile, to obtain a signal processing result that is less likely to cause a decrease in the signal-to-noise (SN) ratio, an amplifying operation for a pixel signal, high-resolution analog-digital (AD) conversion signal processing, and so on are to be performed. Therefore, generation of a control signal at an increased speed and obtaining of a signal processing result that is less likely to cause a decrease in the SN ration have a trade-off relationship.

A technique described below relates to a photoelectric conversion device with which control signals can be generated at an increased speed and a signal processing result that is less likely to cause a decrease in the SN ratio can be obtained.

Hereinafter, embodiments will be described with reference to the drawings. The following embodiments are intended to embody the technical spirit of the disclosure and are not intended to limit the disclosure. The sizes of members and the positional relationships between members illustrated in the drawings may be exaggerated in order to give a clear description. In the following description, the same configurations are assigned the same reference numerals, and descriptions thereof may be omitted.

In the embodiments described below, as the photoelectric conversion device, for example, an image capturing device will be focused and described. However, the embodiments are not limited to the image capturing device. The photoelectric conversion device may be, for example, a ranging device (a device for, for example, measuring a distance by using focus detection or Time of Flight (TOF)) or a photometer (a device for, for example, measuring the amount of incident light) other than the image capturing device.

The term "plan view" herein refers to viewing in a direction perpendicular to a light incident surface of a first substrate described below. In a case where the light incident surface of the first substrate is microscopically a rough surface, "plan view" is defined with reference to the light incident surface of the first substrate when viewed macroscopically.

First Embodiment

A first embodiment of the disclosure will be described with reference to the drawings.

FIG. 1 is a schematic perspective view of a photoelectric conversion device according to this embodiment. The photoelectric conversion device according to this embodiment is formed by staking and bonding a first substrate 10 and a second substrate 20 together. These two substrates are bonded together by, for example, metal bonding in which metal members disposed in an insulating layer of the first substrate 10 and metal members disposed in an insulating layer of the second substrate 20 are bonded together. Metal bonds at each of which corresponding metal members are bonded together are referred to as connection parts 400. As another method for bonding the first substrate 10 and the second substrate 20 together, bumps may be used to bond the substrates together.

On the second substrate 20, pads 300 are disposed, and on the first substrate 10, openings 200 are provided so as to correspond to the positions of the pads 300. The pads 300 and a circuit outside the photoelectric conversion device are connected to each other by wire bonding. Via the pads 300, input signals are received and output signals are transmitted.

Although FIG. 1 illustrates the connection parts 400 on a first surface of the first substrate 10 in order to facilitate understanding of descriptions, the connection parts 400 are disposed on a second surface of the first substrate 10 and is not visible on the first surface of the first substrate 10. Although FIG. 1 illustrates six connection parts 400, the number of connection parts 400 and the positions at which the connection parts 400 are disposed need not be as illustrated in FIG. 1.

The pads 300 need not be disposed on the second substrate 20 and may be disposed on the first substrate 10.

First, a basic configuration according to this embodiment will be described with reference to FIG. 2A, FIG. 2B, FIG. 4, and FIG. 5, and driving will be described with reference to FIG. 6A, FIG. 6B, and FIG. 7.

Figure 2A:
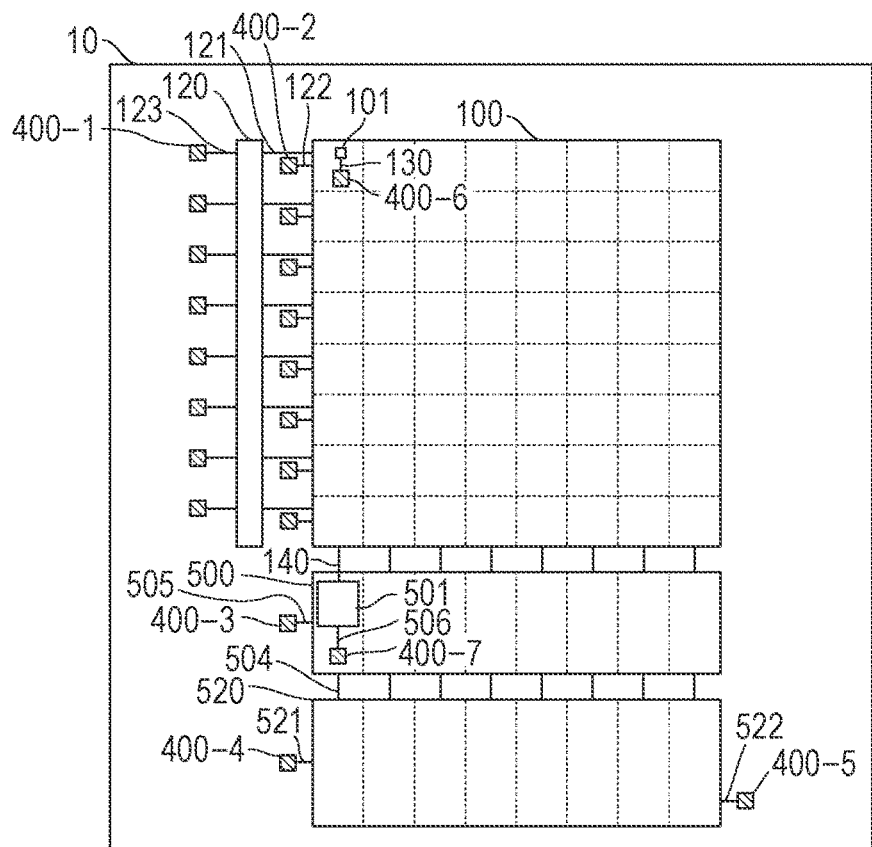
FIGS. 2A and 2B are schematic plan views of the photoelectric conversion device according to the first embodiment.
Figure 2B:
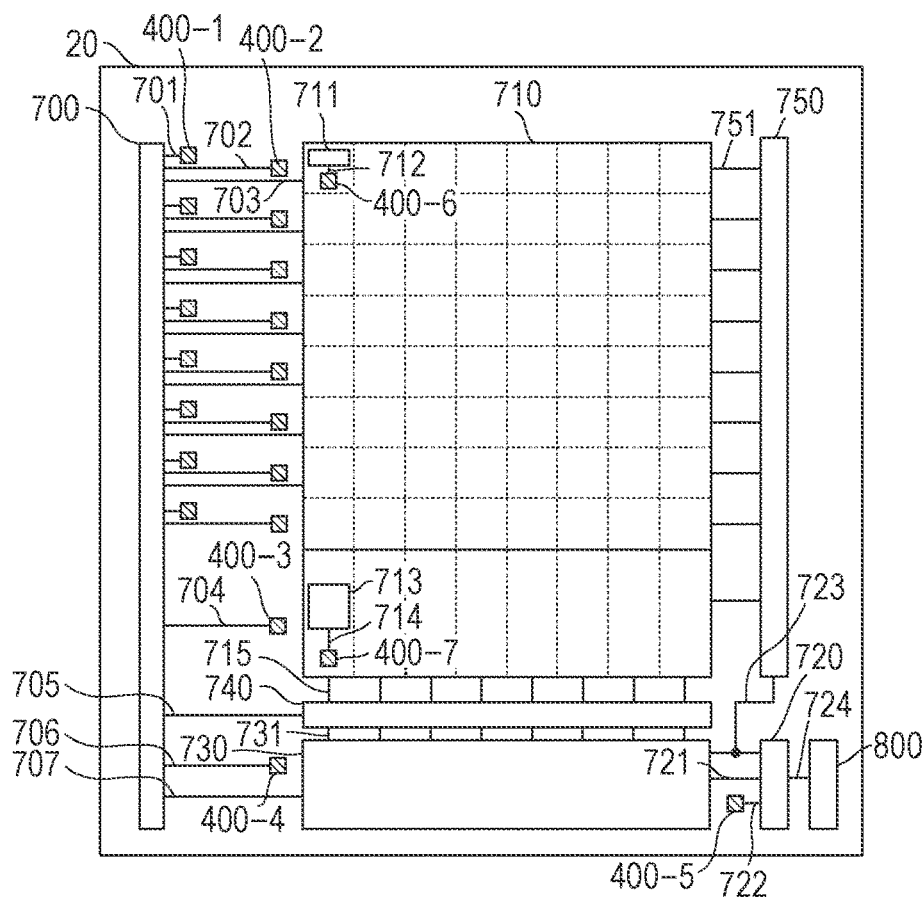

FIG. 2A and FIG. 2B are schematic plan views of the photoelectric conversion device according to this embodiment. In FIG. 2A and FIG. 2B, the openings 200 and the pads 300 illustrated in FIG. 1 are omitted in order to simplify the drawings.

FIG. 2A illustrates a schematic planar layout of the first substrate 10. FIG. 2B illustrates a schematic planar layout of the second substrate 20. FIG. 2A illustrates an example where pixels each including a photoelectric conversion element and a signal processing unit 500 that mainly processes signals (hereinafter referred to as "pixel signals") output from the pixels are disposed on the first substrate 10. The second substrate 20 includes a pixel signal processing control unit 711 including a pixel signal processing unit that processes pixel signals, a driving timing control unit 700 that controls driving of circuits disposed on the first substrate 10, and a digital signal processing circuit. These circuits are disposed at positions different from the position of the signal processing unit 500 and have functions different from those of the signal processing unit 500.

Figure 3A:
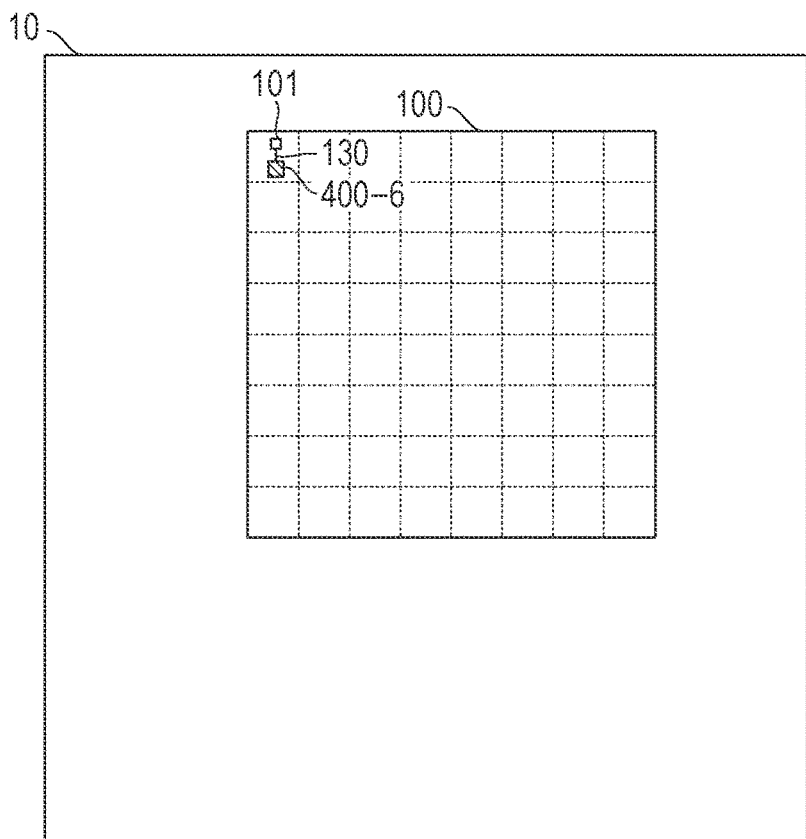
FIGS. 3A and 3B are schematic plan views of the photoelectric conversion device according to a modification of the first embodiment.
Figure 3B:
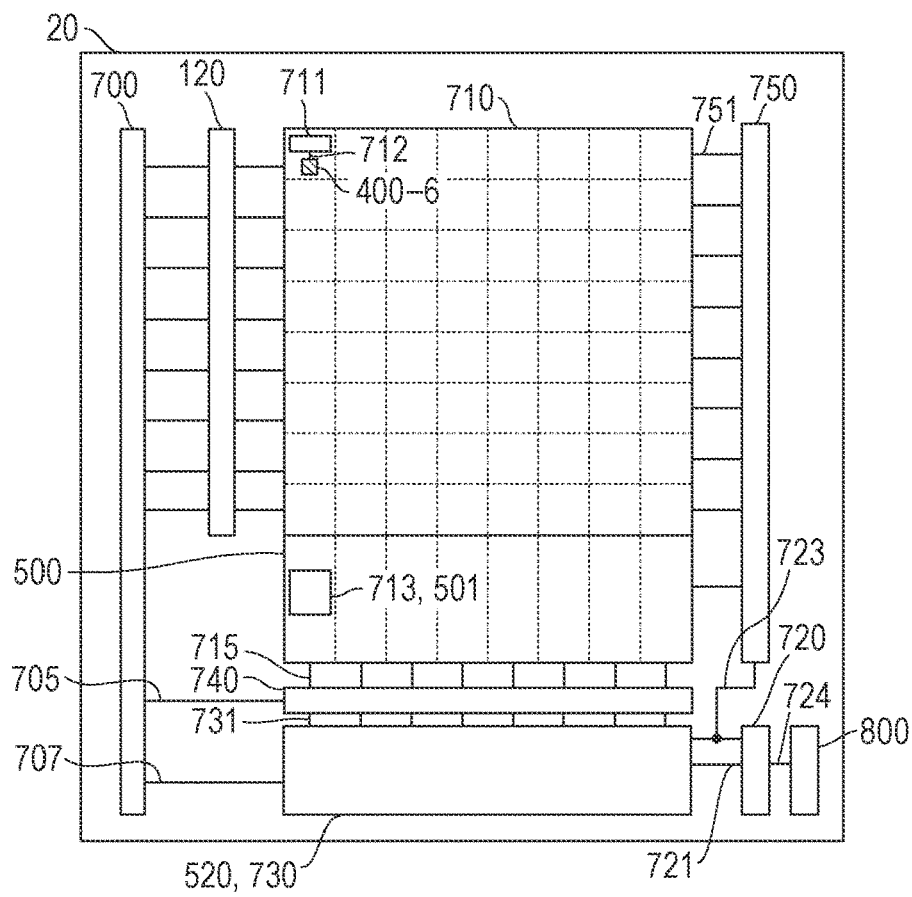

Although the positional relationships between the constituent elements illustrated in FIG. 2A and FIG. 2B will be focused and described below, the positional relationships between the constituent elements need not be as illustrated in FIG. 2A and FIG. 2B. For example, a pixel part 100 that includes a plurality of pixels may be disposed on the first substrate 10 as illustrated in FIG. 3A, and the signal processing unit 500 and peripheral circuits including a vertical scan circuit may be disposed on the second substrate 20 as illustrated in FIG. 3B. Note that FIG. 3B only illustrates an example position at which an AD conversion circuit is disposed, and the positions at which the signal processing unit 500 and so on are disposed need not be as illustrated in FIG. 3B. Further, some of the circuits, such as a timing generation circuit and a digital signal processing circuit, may be provided on the first substrate 10.

As described above, the first substrate 10 and the second substrate 20 are connected to each other by the connection parts 400. The connection parts 400 are disposed on both substrates such that the coordinates of the connection parts 400 on the first substrate 10 are the same as the coordinates of the connection parts 400 on the second substrate 20 on the planar layout. That is, when orthogonally projected onto the first surface of the first substrate 10, the connection parts 400 of the first substrate 10 and those of the second substrate 20 are disposed so as to overlap. In the following description, the connection parts 400 disposed on the first substrate 10 and those disposed on the second substrate 20 are not distinguished from each other. The expression of "connection part 400-1" refers to a connection part 400-1 that is disposed on either the first substrate 10 or the second substrate 20. For members having the same function, sub-numbers are omitted. For example, in a case of the expression of "connection parts 400", a connection part 400-n (n is a natural number) is not distinguished from the others.

In the drawings, wiring lines are illustrated as a single element and the connection parts 400 are illustrated as a single element. In actuality, a plurality of wiring lines, such as a plurality of power lines, a plurality of ground conductors, a plurality of control lines, and a plurality of signal input-output lines, and a plurality of connection parts 400 may be disposed. Even in a case where the same power or the same signal is supplied, a plurality of connection parts 400 may be disposed in order to decrease the resistance of the connection parts 400 and make the connection parts 400 redundant. Even in a case where a plurality of wiring lines or a plurality of connection parts are to be disposed, a single wiring line or a single connection part may be illustrated in a drawing or a description of a single wiring line or a single connection part may be given below in order to simplify the drawing and description.

In FIG. 2A and FIG. 2B, constituent elements and wiring lines may be illustrated so as to have positional relationships in which the constituent elements or the wiring lines do not physically overlap in plan view. In actuality, however, the constituent elements may overlap. Similarly, the positions at which the connection parts 400 are disposed can be flexibly designed relative to the constituent elements, the wiring lines, and so on.

Between the first substrate 10 and the second substrate 20, driving signals for controlling pixels and controlling circuits that process pixel signals, pixel signals subjected to signal processing, and so on are transmitted via the plurality of connection parts 400. First, constituent elements disposed on the first substrate 10 illustrated in FIG. 2A will be described. Next, constituent elements disposed on the second substrate 20 illustrated in FIG. 2B, and signal transmission, control, and driving between the substrates in a state where the substrates are bonded together will be described.

Figure 4:
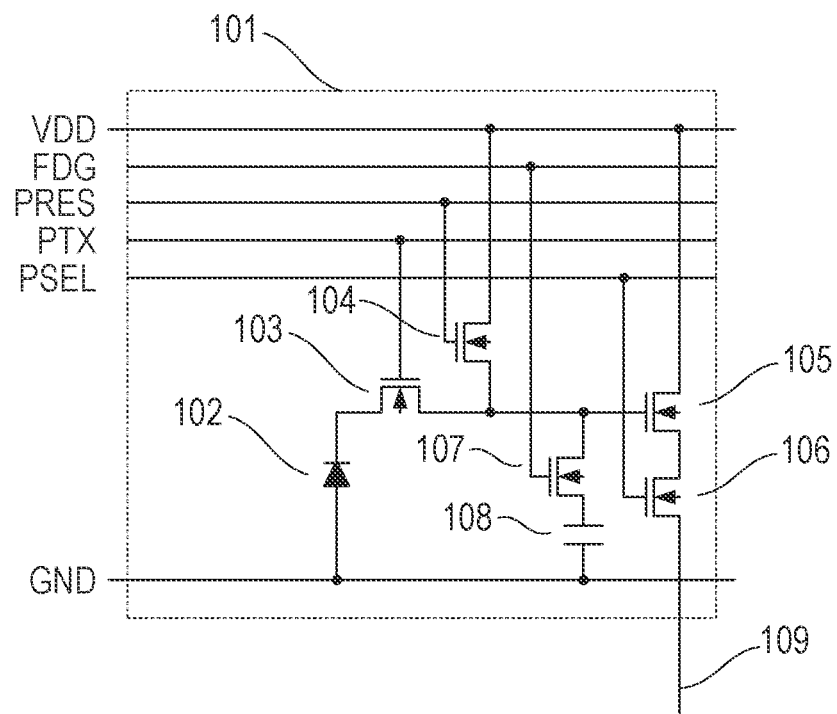
FIG. 4 is a circuit diagram of a pixel according to the first embodiment.
Figure 5:
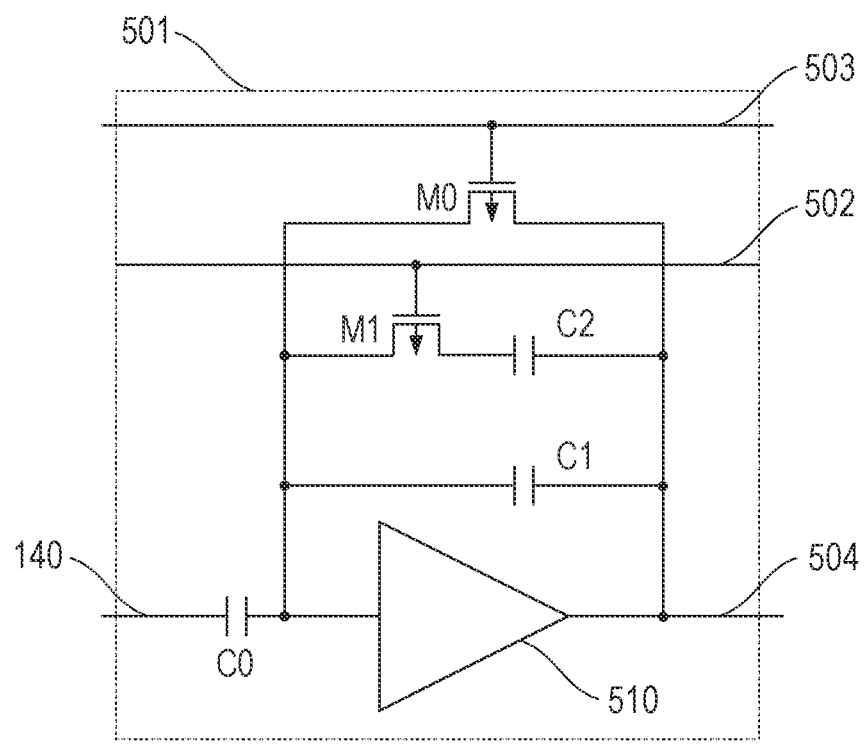
FIG. 5 is a circuit diagram of an amplifier according to the first embodiment.

A configuration of the first substrate 10 will be described with reference to FIG. 2A, FIG. 4, and FIG. 5. In the pixel part 100, pixels 101 each including a photoelectric conversion element 102 illustrated in FIG. 4 are arranged in two dimensions. Each pixel 101 converts an optical signal to an electric signal and outputs the electric signal from the pixel part 100. This embodiment employs a configuration in which driving control can be performed in units of blocks each including a plurality of pixels 101. The plurality of pixels 101 in each unit of block that can be subjected to driving control are also collectively referred to as a pixel block. The pixel part 100 includes, for example, 8×8 pixel blocks, that is, 64 pixel blocks in total, as depicted by dotted lines. Although FIG. 2A illustrates only one pixel 101 in one pixel block, it is assumed that each pixel block includes a plurality of pixels 101. The number of pixel blocks, the definition of the pixel blocks, the number of pixels 101 included in each pixel block, and so on can be changed as appropriate.

When a configuration in which the pixels 101 arranged in two dimensions can be controlled in units of blocks is employed, optimum control can be performed for each block in accordance with the brightness of the object.

The pixel 101 illustrated in FIG. 4 includes a power potential VDD, a ground potential GND, the photoelectric conversion element 102, a transfer transistor 103, a reset transistor 104, an amplifier transistor 105, a selection transistor 106, and an output line 109. The pixel 101 further includes a capacitor selection transistor 107 and a capacitor 108 and can switch the charge-voltage conversion gain of the pixel. The transfer transistor 103 is controlled so as to be turned on or off by a control signal PTX. The reset transistor 104 is controlled so as to be turned on or off by a control signal PRES. The selection transistor 106 is controlled so as to be turned on or off by a control signal PSEL. The capacitor selection transistor 107 is controlled so as to be turned on or off by a control signal FDG. To the output line 109, a plurality of pixels 101 in a corresponding column are connected, and the output line 109 is connected to a circuit disposed outside the pixel part 100. The power potential VDD and the ground potential GND are supplied via power lines not illustrated. Via the pads 300 illustrated in FIG. 1, the power potential VDD and the ground potential GND are supplied to the power lines. In an accumulation operation of the pixel 101, the transfer transistor 103 and the reset transistor 104 are simultaneously turned on first, the photoelectric conversion element 102 is reset, and the transfer transistor 103 is subsequently turned off. The timing when the transfer transistor 103 is turned off is the timing when accumulation starts. The time until when the transfer transistor 103 is subsequently turned on and an electric charge accumulated in the photoelectric conversion element 102 is transferred to a floating diffusion region (FD) that is connected to the gate electrode of the amplifier transistor 105 is an accumulation time. When the capacitor selection transistor 107 is turned on or off, the effective capacitance value of the floating diffusion region can be changed. The electric charge transferred to the floating diffusion region is output to a circuit outside the pixel part 100 via the amplifier transistor 105, the selection transistor 106, and the output line 109.

A pixel control unit 120 controls the pixels 101 via pixel control lines 121. The pixel control unit 120 is, for example, a vertical scan circuit. Although each pixel control line 121 in FIG. 2A is depicted by a single line in order to simplify the drawing, the pixel control line 121 includes a plurality of control lines for the control signals PTX, PRES, PSEL, and FDG. Although reference numerals are omitted, the pixel control line 121 is disposed for each of the 8×8 pixel blocks. Note that control signals for control on a per pixel basis, for control on a per pixel row basis, and for control on a per pixel block basis illustrated in the drawings are not distinguished from each other.

Pixel signals output from the pixel part 100 are input to the signal processing unit 500 via a wiring line 140, which is illustrated as the output line 109 in FIG. 4. The signal processing unit 500 includes a plurality of circuits for processing the pixel signals. The signal processing unit 500 is also configured such that control can be performed in units of blocks each including a plurality of processing circuits as depicted by dotted lines, so as to correspond to the units of pixel blocks.

The signal processing unit 500 includes, for example, a constant current circuit. The amplifier transistor 105 of the pixel 101 is connected to the constant current circuit via the selection transistor 106, the output line 109, and the wiring line 140 to thereby form a source follower circuit. When the source follower circuit is formed, a pixel signal is read from the pixel part 100. An output of the source follower circuit may be further amplified by an amplifier. FIG. 5 is an equivalent circuit diagram of an amplifier 501 that amplifies a pixel signal. The amplifier 501 is constituted by an amplifier circuit 510, an input capacitor C0, feedback capacitors C1 and C2, and switches M0 and M1. The switch M0 is controlled by a reset control line 503, and the switch M1 is controlled by a gain control line 502. The voltage amplification factor of the amplifier 501 is expressed by −input capacitance C0/feedback capacitance (C1, C2). When either the feedback capacitor C1 or the feedback capacitors C1+C2 is selected by the switch M1 in a system in which a negative feedback is applied to the amplifier circuit 510, the voltage amplification factor that is determined by the division ratio between the feedback capacitance C1, C2 and the input capacitance C0 can be switched.

The minus sign added to the voltage amplification factor indicates an inverting amplifier circuit.

The switch M0 is a switch for short-circuiting the input and the output of the amplifier circuit 510. When the switch M0 is turned on before reading of a pixel signal and performing an amplifying operation, the amplifier 501 is reset. After reset is canceled, a pixel signal output from the source follower circuit is amplified with a voltage amplification factor −C0/C1 in a case where the switch M1 is turned off and is output via an amplified-signal output line 504. In a case where the switch M1 is turned on, the pixel signal is amplified with a voltage amplification factor −C0/(C1+C2). In this embodiment, although one type of input capacitor, namely, the input capacitor C0, and two types of feedback capacitors, namely, the feedback capacitors C1 and C2, are provided, a configuration may be employed in which a larger number of input capacitors and a larger number of feedback capacitors are provided to set the voltage amplification factor.

The signal processing unit 500 may further have a plurality of signal processing functions. In this embodiment, the signal processing unit 500 includes an analog-digital conversion circuit (AD conversion circuit). A pixel signal amplified by the amplifier 501 is converted to a digital signal by the AD conversion circuit. The result of AD conversion is stored in a memory unit 520 via the amplified-signal output line 504. The signal processing unit 500 may include a circuit having a function of correlated double sampling (CDS) and sample-holding (S/H) a pixel signal. The signal processing unit 500 may include a circuit for generating a reference power or a clock signal used in a circuit that constitutes the signal processing unit 500. To the signal processing unit 500, the power potential VDD and the ground potential GND are supplied via power lines not illustrated. Note that a power supply for supplying the ground potential GND in the pixel part 100 and a power supply for supplying the ground potential GND in the signal processing unit 500 can be separate power supplies.

The signal processing unit 500 is controlled by control lines 505 and 506. Each of the control lines 505 and 506 includes a plurality of control lines including the gain control line 502 and the reset control line 503 described above. In this embodiment, the control line 505 is a common control line for a plurality of signal processing circuits included in the signal processing unit 500. On the other hand, the control line 506 is a control line for each block corresponding to a plurality of signal processing circuits grouped into one block. For example, the control line 506 includes the gain control line 502 and is capable of controlling the gain of the amplifier 501 for each block. The signals supplied from each of the control lines 505 and 506 are generated by a control signal generation unit not illustrated on the basis of control signals input from the driving timing control unit 700 disposed on the second substrate 20, which will be described below, via control lines 704 and 714 and connection parts 400-3 and 400-7 respectively. The control signal generation unit includes a voltage level shift circuit, a buffer circuit, and a decoder.

The memory unit 520 includes a digital memory for retaining the result of AD conversion and a scan circuit for reading digital data retained in the digital memory. The memory unit 520 is controlled on the basis of a control signal input from the driving timing control unit 700 via a control line 706, a connection part 400-4, and a wiring line 521. The digital data retained in the memory unit 520 is output to the second substrate 20 via a wiring line 522 and a connection part 400-5.

Next, a configuration of the second substrate 20 illustrated in FIG. 2B will be described. Further, a signal transmission relationship and a control relationship with the first substrate 10 via the connection parts 400 will be described.

The driving timing control unit 700 is a circuit for controlling the entire photoelectric conversion device. A control line 701 is a wiring line for transmitting a control signal related to control of the pixel part 100 and is connected to the pixel control unit 120 via a connection part 400-1 and a wiring line 123. Similarly, a control line 702 is a wiring line for transmitting a control signal related to control of the pixel part 100 and is connected to the pixel part 100 via a connection part 400-2 and a pixel control line 122.

A control unit 710 includes a circuit for controlling the pixel part 100 and the signal processing unit 500 of the first substrate 10. In this embodiment, the control unit 710 controls the plurality of pixels 101 and the signal processing unit 500 in units of pixel blocks. Examples of control in units of pixel blocks include control of the accumulation times of pixels. In this embodiment, a configuration is employed in which when orthogonally projected onto the first surface of the first substrate 10, a connection part 400-6 is disposed at a position so as to overlap the pixel part 100, and the accumulation time of each pixel block can be controlled via the connection part 400-6.

The accumulation times of pixels are controlled by the pixel signal processing control unit 711 disposed for each pixel block. The pixel signal processing control unit 711 generates an accumulation control signal on the basis of a signal supplied from the driving timing control unit 700 via a control line 703. The accumulation control signal generated by the pixel signal processing control unit 711 is supplied to the pixel 101 via a wiring line 712, the connection part 400-6, and a wiring line 130.

Note that in FIGS. 2A and 2B, although the pixel signal processing control unit 711 and the connection part 400-6 for only one block is illustrated in order to simplify the drawings, the pixel signal processing control unit 711 and the connection part 400-6 are disposed in every block. A configuration may be employed in which accumulation time control for the pixel part 100 can be performed from the driving timing control unit 700 or the pixel control unit 120 in addition to the pixel signal processing control unit 711. Regarding other control related to pixels, a configuration may be similarly employed in which the control can be performed from any of the driving timing control unit 700, the pixel control unit 120, or the pixel signal processing control unit 711.

The signal processing unit 500 is controlled on a per block basis from a signal processing control unit 713, the control line 714, the connection part 400-7, and the control line 506. As described above, one of the functions, of the signal processing unit 500, of performing control on a per block basis is control of the voltage amplification factor of the amplifier 501. The other control includes driving current control for the amplifier circuit 510 and power-on and power-down control. The other functions of performing control on a per block basis include an AD conversion operation and control of an analog-digital conversion gain (AD conversion gain).

A pixel signal subjected to AD conversion in the signal processing unit 500 and retained in the memory unit 520 is input to a digital signal processing unit 720 via the wiring line 522, the connection part 400-5, and a wiring line 722.

The digital signal processing unit 720 performs various types of digital signal processing, such as a noise reduction process, a digital gain process, offset addition or subtraction, a compression process, and a data scrambling process, for the input digital signal. The digital data or part of the digital data processed by the digital signal processing unit 720 is input to a digital signal processing control unit 730 via a wiring line 721.

The digital signal processing control unit 730 has a function of calculating, for example, an optimum accumulation time for each pixel block and the voltage amplification factor for each block of the signal processing unit 500 on the basis of pixel signals subjected to signal processing by the signal processing unit 500. Note that accumulation time control may be performed by controlling the control unit 710 to thereby indirectly control pixels, instead of directly controlling pixels from the digital signal processing control unit 730. Accumulation time control may be performed by the control unit 710 and the digital signal processing control unit 730. The control unit 710 may include some of the functions of the driving timing control unit 700. The driving timing control unit 700 may include the control unit 710. Control information including a setting of the accumulation time and that of the voltage amplification factor calculated by the digital signal processing control unit 730 is input to the control unit 710 via a wiring line 723. The control unit 710 generates an accumulation control signal for the pixel 101 and a voltage amplification factor control signal for the amplifier 501, and the generated control signals are input to the control unit 710 via a wiring line 751. In the control unit 710, the pixel signal processing control unit 711 controls the pixel 101, and the signal processing control unit 713 controls the signal processing unit 500. The control information including the accumulation time and the voltage amplification factor calculated by the digital signal processing control unit 730 is also input to the digital signal processing unit 720 via the wiring line 723. The digital signal processing unit 720 can process a pixel signal, that is, a digital signal, input from the memory unit 520 with appropriate parameters on the basis of the control information calculated by the digital signal processing control unit 730.

The digital signal processing control unit 730 is connected to a memory unit 740 via a wiring line 731. When a program stored in the memory unit 740 is executed in a process of calculating the accumulation time and the voltage amplification factor by the digital signal processing control unit 730, various processes are performed by using a trained model created by machine learning using a deep neural network. This trained model (neural network calculation model) may be designed on the basis of parameters generated by inputting to a predetermined machine learning model, training data in which input signals corresponding to outputs from the pixel part 100 and labels corresponding to the input signals are associated with each other. The predetermined machine learning model may be a learning model using a multilayer neural network (also called a multilayer neural network model). A calculation process is, for example, a process of multiplying image data obtained from the pixel part 100 by a dictionary factor of the trained model.

A result obtained by the above-described calculation process (calculation result) can be output to an output interface unit. Note that the calculation result can include image data obtained by performing the calculation process using the trained model and various types of information (metadata) obtained from the image data. The control unit 710 is also connected to the memory unit 740 via a wiring line 715 and is configured to perform various types of signal processing as in the digital signal processing control unit 730.

The pixel signal subjected to digital signal processing by the digital signal processing unit 720 is output to the outside of the photoelectric conversion device via a wiring line 724 and an output unit 800. The output method of the output unit 800 is, for example, a method in which a voltage is output from a single terminal as in a buffer circuit or a low voltage differential signaling (LVDS) method using two differential terminals. In a case where the digital signal input from the digital signal processing unit 720 is parallel data, the output unit 800 may have, for example, a parallel-serial conversion (P/S conversion) function.

The pixel signal processing control unit 711 that processes pixel signals has a function of controlling the accumulation times of pixels on the basis of a control signal input from the driving timing control unit 700 and that input from a control unit 750 and also has a function of processing the pixel signals. For example, the pixel signal processing control unit 711 includes an AD conversion circuit having a resolution lower than that of the AD conversion circuit included in the signal processing unit 500 and can process a pixel signal input via the connection part 400-6. The pixel signal processing control unit 711 is configured to be capable of determining an approximate object brightness. The pixel signal processing control unit 711 is configured to further have a function of enabling control of the pixel 101 on the basis of brightness information about the object.

Specifically, for example, the AD conversion circuit having a low resolution is a one-bit AD conversion circuit for determining whether a signal level is larger or smaller than a specific reference voltage, and the pixel signal processing control unit 711 is configured to be capable of determining whether the brightness of the object is larger or smaller than a specific brightness. Further, the pixel signal processing control unit 711 is configured to be capable of controlling the capacitor selection transistor 107 of the pixel 101 on the basis of the result of determination of the object brightness.

For example, in a case where the brightness of an object is greater than or equal to the specific brightness and the capacitor selection transistor 107 of the pixel 101 is turned off, the amplitude of the output line 109 is large and may exceed the input range of the signal processing unit 500. Accordingly, an image having no resolution is obtained, and it is not possible to identify the object.

In such a case, in this embodiment, on the basis of the result of one-bit AD conversion, the capacitor selection transistor 107 that is in an off state is turned on, and the capacitor 108 is connected to the gate of the amplifier transistor 105 in the pixel 101. Accordingly, the capacitance of the floating diffusion region can be effectively increased, and the amplitude of the output line 109 can be reduced. The signal amplitude can be appropriately adjusted relative to the input range of the signal processing unit 500.

With the configuration of this embodiment, one-bit AD conversion or low-resolution AD conversion can be performed at a high speed, and the pixel 101 can be controlled before signal processing by the signal processing unit 500 starts.

Note that pixels for which pixel signals are monitored by the pixel signal processing control unit 711, the number of pixels, and the resolution of the AD conversion circuit can be changed as appropriate for each pixel block. A configuration may be employed in which the voltage amplification factor of the amplifier 501 and the AD conversion gain of the AD conversion circuit can be controlled from the signal processing control unit 713 on the basis of the result of determination of the brightness of the object by the pixel signal processing control unit 711. When the result of signal processing by the pixel signal processing control unit 711 is input to the digital signal processing unit 720 or the digital signal processing control unit 730 via the wiring line 751, the control unit 750, and the wiring line 723, the result can be reflected to various types of digital signal processing.

When the accumulation time of the pixel 101 and the voltage amplification factor of the amplifier 501 are set and controlled individually for each pixel block from the driving timing control unit 700, appropriate setting can be performed in accordance with the brightness of each block even for an object having a wide brightness range. Accordingly, an image having a wide dynamic range can be obtained. The digital signal processing control unit 730 updates or generates control information in real time on the basis of object information. For example, even in a case where the brightness of an object continuously changes as in moving image capturing, appropriate control can be performed for each block in association with changes in the object brightness.

Figure 6A:
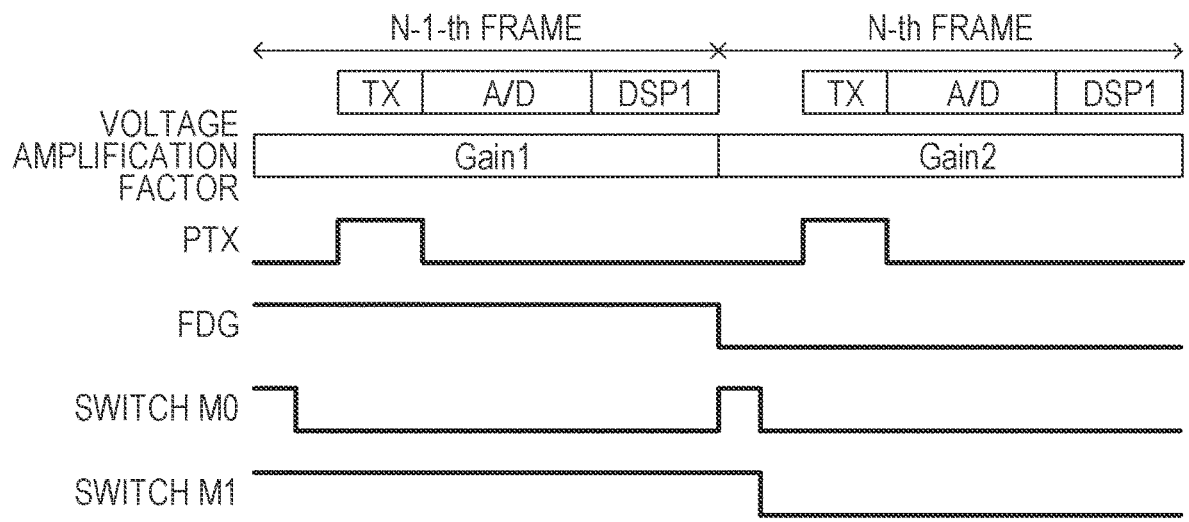
FIGS. 6A and 6B illustrate driving timings of the photoelectric conversion device according to the first embodiment.
Figure 6B:
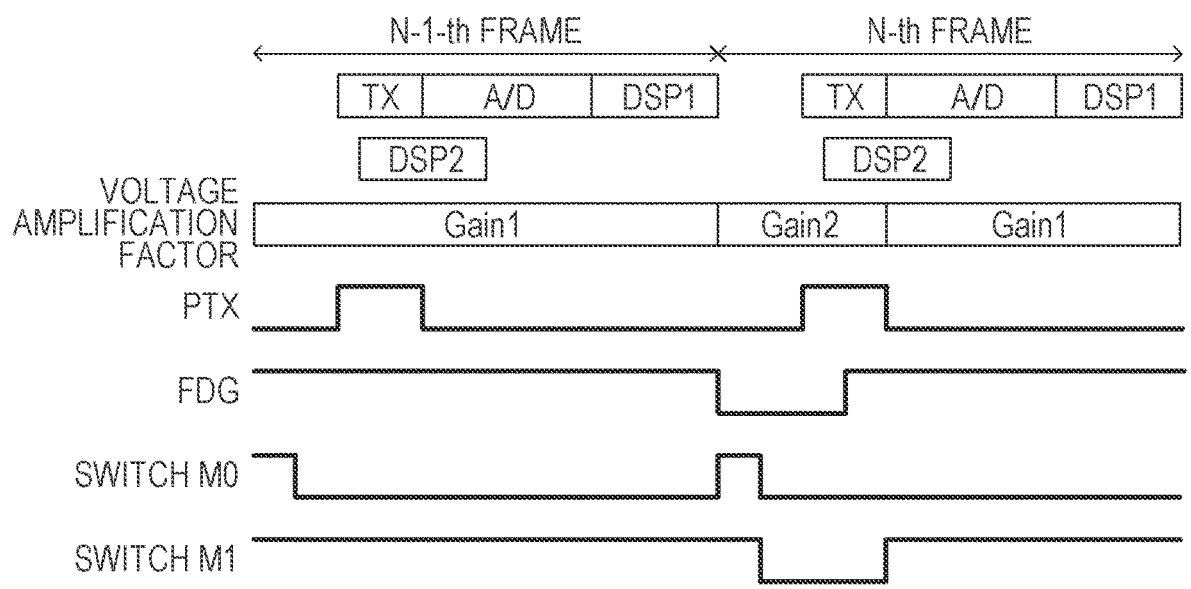
Figure 7:
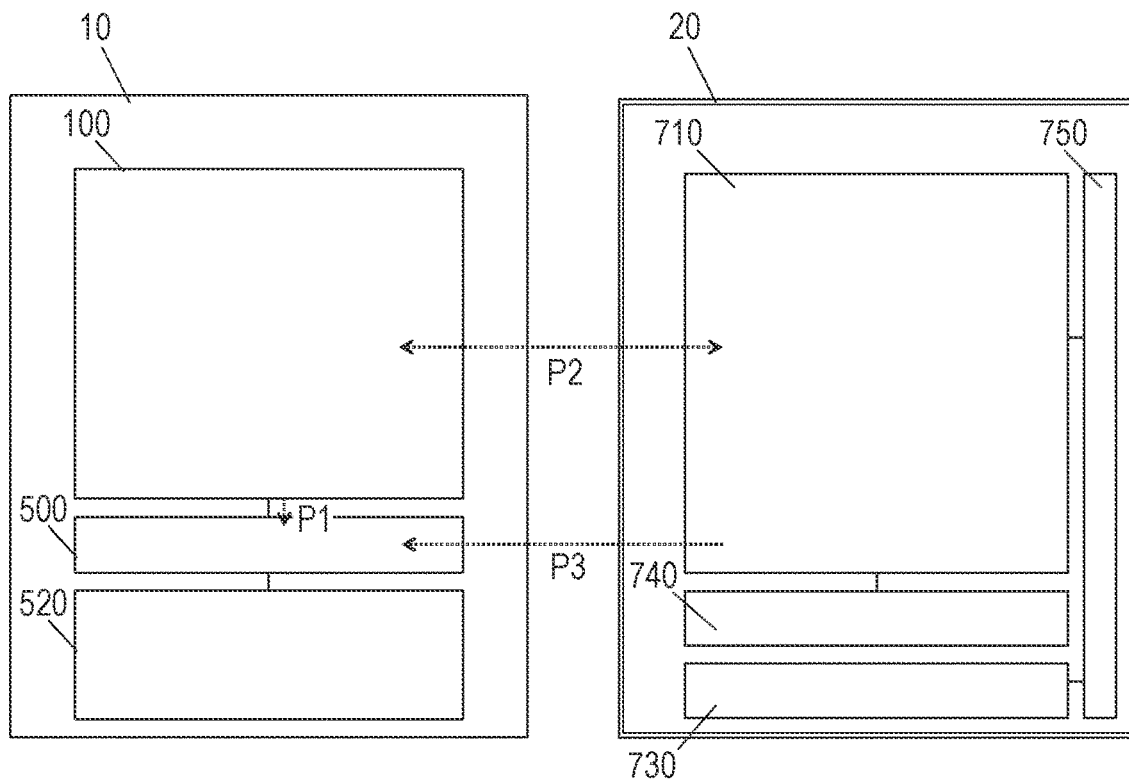
FIG. 7 is a functional block diagram illustrating an overview of the first embodiment.

FIGS. 6A and 6B are diagrams for explaining driving timings of the photoelectric conversion device according to this embodiment. Regarding FIGS. 6A and 6B, the transistors and switches are in an on state when the pulse is at a high level and are in an off state when the pulse is at a low level. "TX" is a period in which an electric charge is transferred from the photoelectric conversion element 102 to the floating diffusion region. During the period in which the control signal PTX is at the high level, an electric charge is transferred from the photoelectric conversion element 102 to the floating diffusion region. "AD" is a period in which a pixel signal of the amplifier 501 is amplified and subjected to AD conversion in the signal processing unit 500. "DSP1" is a period in which the digital signal processing control unit 730 performs various calculations and generates a control signal on the basis of digital data input from the digital signal processing unit 720. "DSP2" is a period in which the pixel signal processing control unit 711 performs AD conversion for a pixel signal input from the pixel 101 with a low resolution and generates a control signal on the basis of the result of AD conversion. The voltage amplification factor of the amplifier 501 is denoted as Gain1 or Gain2. The voltage amplification factor denoted as Gain2 is larger than Gain1.

FIG. 6A illustrates a comparative form in which the photoelectric conversion device is driven on the basis of calculations and control by the digital signal processing control unit 730, and the pixel signal processing control unit 711 is not operated. In this case, on the basis of calculations and a control signal in "DSP1" corresponding to an N−1 (N: a natural number)-th frame, the setting of the accumulation time of the pixel 101 and the setting of the voltage amplification factor of the amplifier 501 are reflected to N-th and subsequent frames. In the driving example illustrated in FIG. 6A, it is determined that the brightness of a certain pixel block is low in the N−1-th frame, and control is performed for setting such that the accumulation time is extended, the voltage amplification factor is increased, or the capacitor 108 is unselected in the N-th and subsequent frames. Therefore, in FIG. 6A, the voltage amplification factor is controlled and changed from Gain1 to Gain 2 in the N-th frame, and the capacitor 108 of the pixel 101 is controlled by the control signal FDG so as to transition from a selected state to an unselected state.

FIG. 6B illustrates an example where the photoelectric conversion device is driven on the basis of calculations and control by the digital signal processing control unit 730 and the pixel signal processing control unit 711. In the example driving illustrated in FIG. 6B, as in FIG. 6A, the setting of the accumulation time of the pixel 101 and the setting of the voltage amplification factor of the amplifier 501 are reflected to the N-th frame on the basis of calculations and a control signal in "DSP1" corresponding to the N−1-th frame. In the N-th frame, a "DSP2" operation period is set so as to be coincident with the "TX" operation period. By the "DSP2" operation, the capacitor 108 of the pixel 101 is controlled by the control signal FDG so as to transition from the unselected state to the selected state on the basis of a pixel signal in the N-th frame, and the voltage amplification factor of the amplifier 501 is controlled and changed from Gain2 to Gain1.

In the case of FIG. 6A, when the brightness of the object changes to a high brightness in the N-th and subsequent frames to which the settings are reflected, a signal read from the pixel 101 may exceed the input range of the signal processing unit 500 and a correct image might not be obtained. Meanwhile, there may be a case where it is determined that the brightness is high in the N−1-th frame and the settings are calculated so as to shorten the accumulation time and decrease the voltage amplification factor in the N-th and subsequent frames. When the brightness of the object changes to a low brightness in the N-th and subsequent frames to which the settings are reflected, a signal read from the pixel 101 is low and the pixel signal may be submerged in noise. Similarly, for an object having a brightness that rapidly and continuously changes, the accumulation time and the voltage amplification factor calculated and set by the digital signal processing control unit 730 might not be appropriate settings for the object. The possibilities of these cases can be reduced by accelerating an operation of reading a pixel signal and increasing the signal processing speed of the signal processing unit 500. Meanwhile, to obtain an image having a high SN ratio, a response time for a pixel signal and high-resolution A/D conversion are necessary, which requires an appropriate signal processing time.

In this embodiment, a path through which a signal from a pixel is output to a first signal processing unit and a path through which the signal from the pixel is output to a second signal processing unit are different. For example, as illustrated in FIG. 7, a signal generated in a pixel included in the pixel part 100 and output from the pixel is output to both the signal processing unit 500 (second signal processing unit) and the control unit 710 that includes the pixel signal processing unit (first signal processing unit). That is, a path P1 for output to the signal processing unit 500 and a path P2 for output to the pixel signal processing unit are provided. The pixel is controlled on the basis of the result of processing of the output to the pixel signal processing unit through the path P2. According to this embodiment, the pixel signal output through the path P2 is processed by the pixel signal processing unit, and the pixel of the pixel part 100 can be controlled on the basis of the result of processing. Meanwhile, signal processing, such as AD conversion, can be performed on the basis of the pixel signal output through the path P1. Therefore, control signals can be generated at an increased speed, and a signal processing result with which a decrease in the SN ratio is less likely to occur can be obtained.

According to this embodiment, the pixel signal processing control unit 711 can monitor a pixel signal in a frame and determine the brightness, and can control the pixel 101 and the signal processing unit 500 in the same frame. In a case where settings determined by the digital signal processing control unit 730 are not appropriate, the pixel 101 and the signal processing unit 500 are controlled to thereby perform signal processing in an appropriate range. Therefore, for an object having a wide brightness range, an image having a wide dynamic range can be obtained regardless of changes in the brightness and the moving speed of the object.

Second Embodiment

Figure 8:
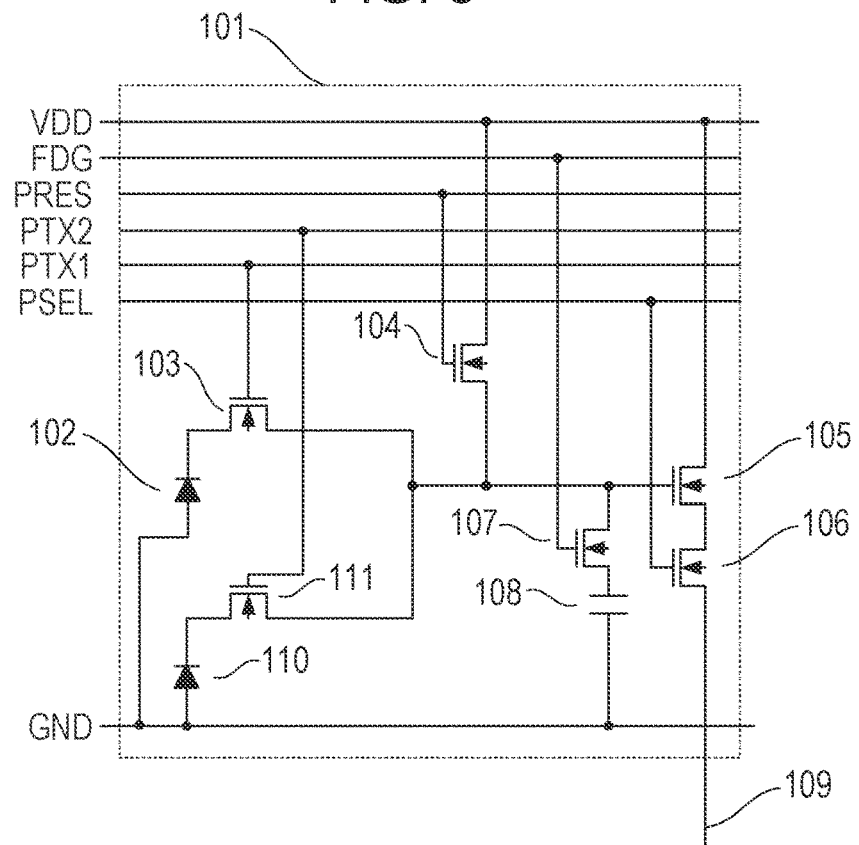
FIG. 8 is a circuit diagram of a pixel according to a second embodiment.
Figure 9:
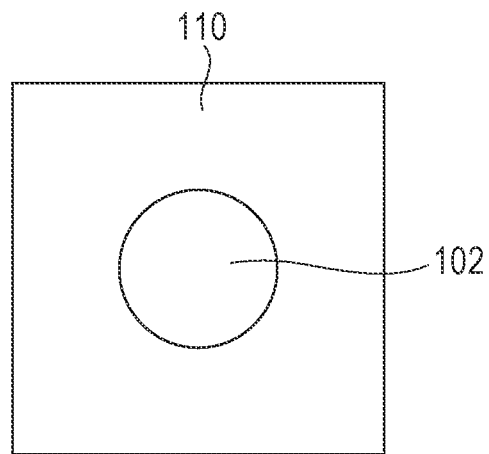
FIG. 9 is a schematic plan view of example photoelectric conversion elements in the pixel according to the second embodiment.

FIG. 8 is a circuit diagram of a pixel of the photoelectric conversion device according to a second embodiment of the disclosure, and FIG. 9 is a schematic plan view of two photoelectric conversion elements included in the pixel according to this embodiment. The photoelectric conversion device according to this embodiment is different from that of the first embodiment in that the photoelectric conversion device includes two photoelectric conversion elements. Differences from the first embodiment will be focused and described below. Matters other than those described below are substantially the same as those in the first embodiment, and therefore, configurations the same as those in the first embodiment are assigned the same reference numerals, and descriptions thereof may be omitted.

The pixel 101 illustrated in FIG. 8 includes a photoelectric conversion element 110 having a sensitivity the same as or different from that of the photoelectric conversion element 102, and the photoelectric conversion element 110 is connected to the gate of the amplifier transistor 105 via a transfer transistor 111. The transfer transistors 103 and 111 are respectively controlled by control lines PTX1 and PTX2. The control lines PTX1 and PTX2 are controlled in accordance with an operation mode.

Note that the photoelectric conversion elements 102 and 110 may be configured such that the light receiving areas and the light block patterns thereof are the same or different on the planar layout. FIG. 9 illustrates, as an example of the photoelectric conversion element 110, a photoelectric conversion element having an area different from that of the photoelectric conversion element 102 to thereby change the sensitivity. The conditions for forming the photoelectric conversion elements in a process may be the same or different.

Color filters respectively disposed on the light receiving surfaces of the photoelectric conversion elements 102 and 110 may be in the same color or different colors. Further, the photoelectric conversion elements 102 and 110 may be disposed in one micro-lens so as to be capable of detecting a phase difference.

In an operation mode according to this embodiment, for example, driving timings by the control lines PTX1 and PTX2 are set to the same driving timings. Accordingly, reading from the photoelectric conversion element 102 and reading from the photoelectric conversion element 110 are simultaneously performed for the same accumulation time, and an image having a high sensitivity can be obtained. For example, in another operation mode, reading from the photoelectric conversion element 102 and reading from the photoelectric conversion element 110 are performed at different timings for the same accumulation time, and reading with an increased resolution as reading from another pixel can be performed or phase detection can be performed from the difference between two signals. For example, in yet another operation mode, reading from the photoelectric conversion element 102 and reading from the photoelectric conversion element 110 are performed at different timings for different accumulation times, and the signals are combined in signal processing in the subsequent stage. Accordingly, an image having a wide dynamic range can be obtained.

These operation modes may be controlled by signal processing by the pixel signal processing control unit 711 or the digital signal processing control unit 730. For example, in accordance with a pixel signal level read from one of the photoelectric conversion element 102 or the photoelectric conversion element 110, the other photoelectric conversion element is controlled. In a case where a pixel signal level read from one of the photoelectric conversion elements is greater than or equal to a predetermined value, the read timing for the other photoelectric conversion element is made different, and signal processing can be performed as signal processing for another pixel. In addition to performing signal processing as signal processing for another pixel, control in which, for example, signals are used in phase difference detection or signals are not read can be performed. In a case where a pixel signal level read from one of the photoelectric conversion elements is less than the predetermined value, reading from the other photoelectric conversion element is simultaneously performed. Accordingly, an image having a high sensitivity can be obtained. As in the first embodiment, on the basis of the results of processing by the pixel signal processing control unit 711 and the digital signal processing control unit 730, settings of signal processing by the signal processing unit 500 and the digital signal processing unit 720 are made to correspond to the operation mode. Accordingly, an appropriate signal processing result can be obtained.

According to this embodiment, as in the first embodiment, control signals can be generated at an increased speed and a signal processing result with which a decrease in the SN ratio is less likely to occur can be obtained. In this embodiment, a plurality of photoelectric conversion elements are provided in the pixel 101, and the operation mode can be switched for the pixel part 100 or for each pixel block by signal processing and control by the pixel signal processing control unit 711 and the digital signal processing control unit 730. Accordingly, in a case where the photoelectric conversion device is used as an image capturing device, optimum image capture conditions can be set for the object from the viewpoints of dynamic range, power consumption, and so on. When control from outside the photoelectric conversion device is combined, various applications can be implemented.

Third Embodiment

Figure 10:
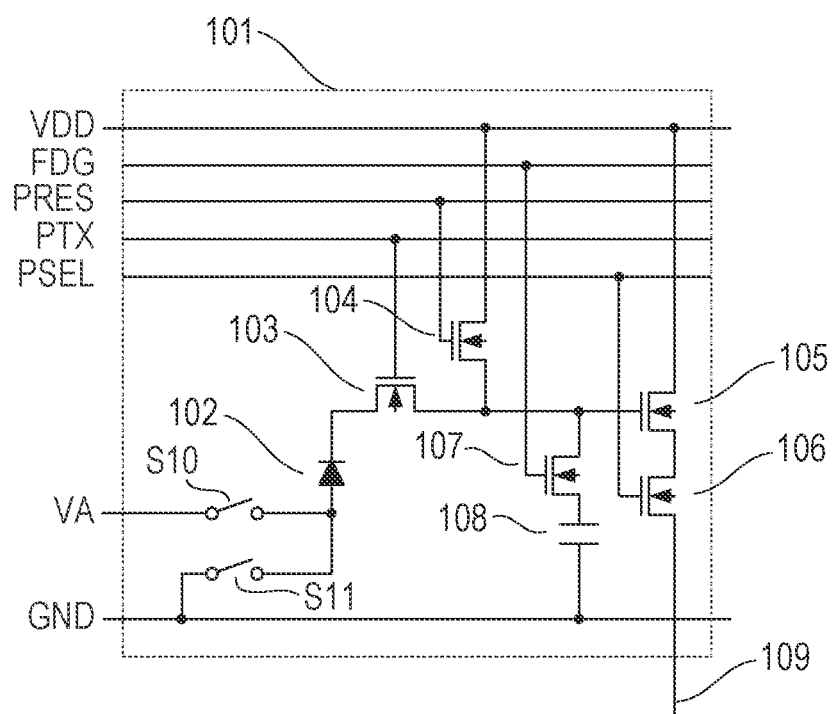
FIG. 10 is a circuit diagram of a pixel according to a third embodiment.

FIG. 10 is a circuit diagram of a pixel of the photoelectric conversion device according to a third embodiment of the disclosure. This embodiment is different from the first embodiment in that the anode terminal voltage of the photoelectric conversion element can be switched. Differences from the first embodiment will be focused and described below. Matters other than those described below are substantially the same as those in the first embodiment, and therefore, configurations the same as those in the first embodiment are assigned the same reference numerals, and descriptions thereof may be omitted.

In the pixel 101 illustrated in FIG. 10, a switch S10 is disposed between the anode of the photoelectric conversion element 102 and a signal line via which a reference voltage VA is supplied, and a switch S11 is disposed between the anode and a signal line via which the ground potential is supplied. A voltage to be applied to the anode can be switched between the reference voltage VA and the ground potential GND by controlling the switches S10 and S11 so as to be turned on or off. The reference voltage VA is a voltage with which a reverse bias can be applied to the photoelectric conversion element 102 and is set to for example, a negative voltage. The reference voltage VA is, for example, −20 V. In a state where the switch S10 is turned on and the switch S11 is turned off, a reverse bias voltage that causes avalanche multiplication in the photoelectric conversion element 102 is supplied, and avalanche breakdown occurs when a photon is incident on the photoelectric conversion element 102.

The gate potential of the transfer transistor 103 and that of the reset transistor 104 are appropriately set, and the resistance between the power potential VDD and the cathode of the photoelectric conversion element 102 is denoted by R. With a current that flows when the photoelectric conversion element 102 is in an avalanche breakdown state and with the resistance R, incidence of a photon can be detected as a voltage change. When the number of detected voltage changes is counted, the number of times a photon is incident can be counted, and an image having a high SN ratio can be obtained for an object having a low brightness. A driving mode in a state where the switch S10 is turned on and the switch S11 is turned off is referred to as an APD mode.

In the APD mode, a counter for an operation of counting photons is used. For example, the pixel signal processing control unit 711 is configured to have a counter function. A count value retained in the pixel signal processing control unit 711 is read by the driving timing control unit 700 via the control line 703 in a pixel selection operation. The selected count value is read by the digital signal processing unit 720 and the digital signal processing control unit 730 via the wiring line 751, the control unit 750, and the wiring line 723.

When the switch S10 is turned off and the switch S11 is turned on, the photoelectric conversion element 102 accumulates a photo-charge by an accumulation operation for a specific time as described in the first embodiment, and the photo-charge is read to thereby obtain an image. This operation mode is referred to as a PD mode.

In this embodiment, as in the first embodiment and the second embodiment, pixels are controlled by the pixel signal processing control unit 711. Specifically, in this embodiment, the APD mode and the PD mode are controlled by signal processing by the pixel signal processing control unit 711 and the digital signal processing control unit 730. In this embodiment a path through which a pixel signal is input to the digital signal processing unit 720 differs between the APD mode and the PD mode. Processing in the APD mode and the PD mode is performed in which information is input to the digital signal processing unit 720 from the pixel signal processing control unit 711 via the wiring line 751, the control unit 750, and the wiring line 723, and appropriate digital signal processing and sorting are performed.

In general, the SN ratio of a region in which the object brightness is low is more favorable in the APD mode than in the PD mode. In a region in which the object brightness is greater than or equal to a specific brightness, the difference in the SN ratio between the APD mode and the PD mode decreases due to the effect of photo shot noise. When the object brightness increases, the number of times a photon counting operation is performed increases in the APD mode, which results in an increase in power consumption. Therefore, in a region in which the object brightness is greater than or equal to the specific brightness, an operation in the PD mode is efficient from the viewpoint of power consumption.

In this embodiment, the mode in which the pixel 101 is driven can be switched between the APD mode and the PD mode by the pixel signal processing control unit 711 and the digital signal processing control unit 730 in accordance with the object brightness, and an image having a high SN ratio can be obtained while an increase in power consumption is suppressed.

Fourth Embodiment

Figure 11:
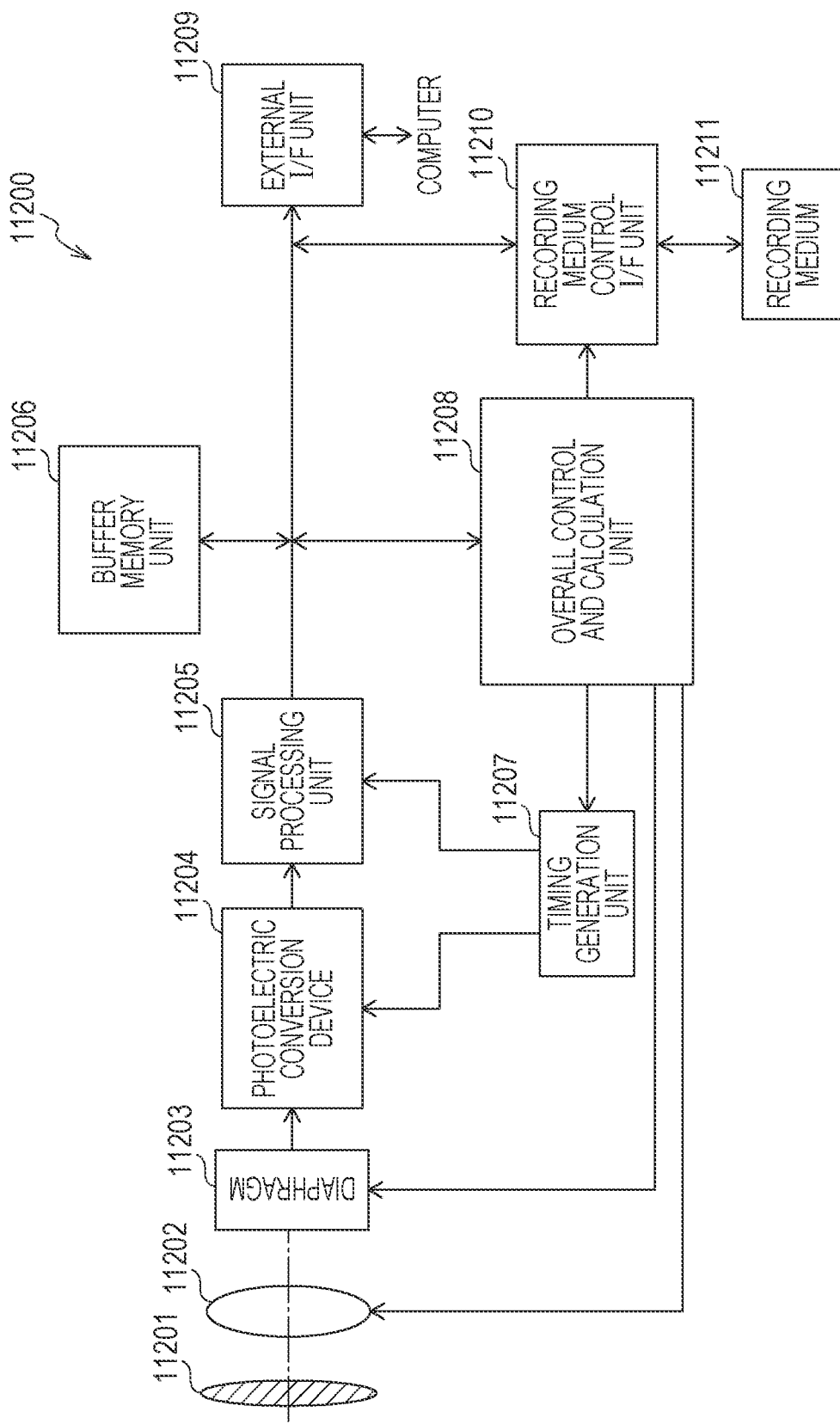
FIG. 11 is a functional block diagram of a photoelectric conversion system according to a fourth embodiment.

FIG. 11 is a block diagram illustrating a configuration of a photoelectric conversion system 11200 according to this embodiment. The photoelectric conversion system 11200 according to this embodiment includes a photoelectric conversion device 11204. As the photoelectric conversion device 11204, the photoelectric conversion device described in any of the above-described embodiments can be used. The photoelectric conversion system 11200 can be used as, for example, an image capturing system. Specific examples of the image capturing system include a digital still camera, a digital camcorder, a monitoring camera, and a network camera. FIG. 11 illustrates, for example, a digital still camera as the photoelectric conversion system 11200.

The photoelectric conversion system 11200 illustrated in FIG. 11 includes the photoelectric conversion device 11204 and a lens 11202 for forming an optical image of an object on the photoelectric conversion device 11204. The photoelectric conversion system 11200 includes a diaphragm 11203 for making the amount of light that passes through the lens 11202 variable and a barrier 11201 for protecting the lens 11202. The lens 11202 and the diaphragm 11203 constitute an optical system for concentrating light onto the photoelectric conversion device 11204.

The photoelectric conversion system 11200 includes a signal processing unit 11205 that processes an output signal output from the photoelectric conversion device 11204. The signal processing unit 11205 performs a signal processing operation of performing various corrections and compression for an input signal as necessary and outputting the signal. The photoelectric conversion system 11200 further includes a buffer memory unit 11206 for temporarily storing image data and an external interface unit (external I/F unit) 11209 for communicating with an external computer and so on. The photoelectric conversion system 11200 further includes a recording medium 11211, which is, for example, a semiconductor memory, to or from which captured image data is recorded or read and a recording medium control interface unit (recording medium control I/F unit) 11210 for recording to or reading from the recording medium 11211. The recording medium 11211 may be integrated into the photoelectric conversion system 11200 or may be attachable and detachable. Communication from the recording medium control I/F unit 11210 to the recording medium 11211 and communication from the external I/F unit 11209 may be performed wirelessly.

The photoelectric conversion system 11200 further includes an overall control and calculation unit 11208 that performs various calculations and that controls the entire digital still camera, and a timing generation unit 11207 that outputs various timing signals to the photoelectric conversion device 11204 and to the signal processing unit 11205. The timing signals and so on may be externally input, and the photoelectric conversion system 11200 is to include at least the photoelectric conversion device 11204 and the signal processing unit 11205 that processes an output signal output from the photoelectric conversion device 11204. The overall control and calculation unit 11208 and the timing generation unit 11207 may be configured to execute some or all of the control functions of the photoelectric conversion device 11204.

The photoelectric conversion device 11204 outputs an image signal to the signal processing unit 11205. The signal processing unit 11205 performs predetermined signal processing for the image signal output from the photoelectric conversion device 11204 and outputs image data. The signal processing unit 11205 uses the image signal to generate an image. The signal processing unit 11205 may perform range calculation for the signal output from the photoelectric conversion device 11204. Note that the signal processing unit 11205 and the timing generation unit 11207 may be mounted in the photoelectric conversion device 11204. That is, the signal processing unit 11205 and the timing generation unit 11207 may be provided on the substrate on which pixels are disposed or may be provided on a separate substrate. When the image capturing system is configured by using the photoelectric conversion device according to any of the above-described embodiments, an image capturing system that can obtain a higher-quality image can be implemented.

Fifth Embodiment

Figure 12:
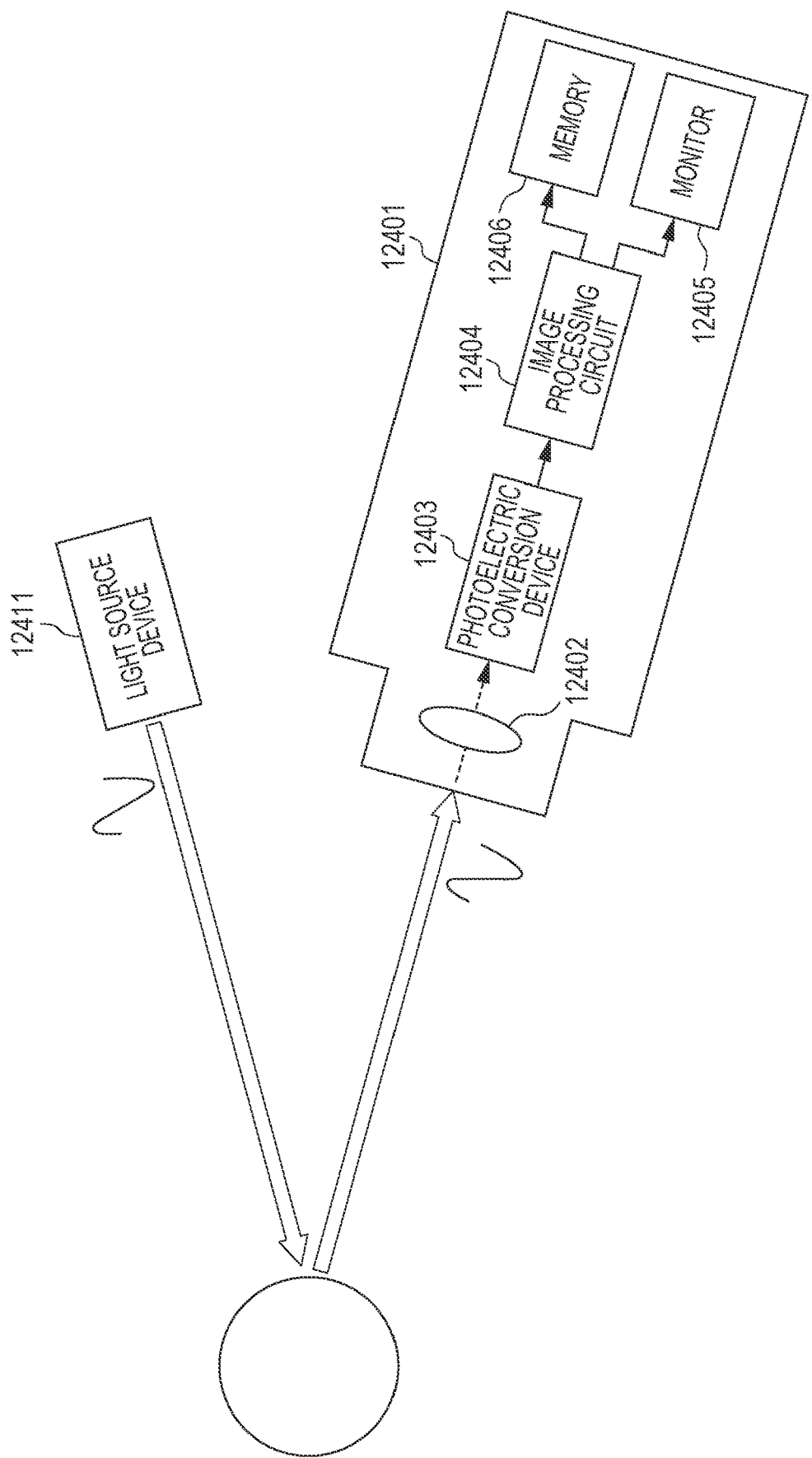
FIG. 12 is a functional block diagram of a photoelectric conversion system according to a fifth embodiment.

FIG. 12 is a block diagram of a photoelectric conversion system including the photoelectric conversion device according to any one of the first to third embodiments. FIG. 12 illustrates an example configuration of a range image sensor as the photoelectric conversion system.

As illustrated in FIG. 12, a range image sensor 12401 is constituted by an optical system 12402, a photoelectric conversion device 12403, an image processing circuit 12404, a monitor 12405, and a memory 12406. When the range image sensor 12401 receives light projected toward an object from a light source device 12411 and reflected from the surface of the object (modulated light or pulsed light), a range image corresponding to the distance to the object can be obtained.

The optical system 12402 is constituted by a single lens or a plurality of lenses, guides image light (incident light) from the object to the photoelectric conversion device 12403, and forms an image on the light receiving surface (sensor part) of the photoelectric conversion device 12403.

As the photoelectric conversion device 12403, the photoelectric conversion device according to any of the above-described embodiments can be used, and a range signal that indicates a distance obtained from a received-light signal output from the photoelectric conversion device 12403 is supplied to the image processing circuit 12404.

The image processing circuit 12404 performs image processing for creating a range image on the basis of the range signal supplied from the photoelectric conversion device 12403. The range image (image data) obtained by the image processing is supplied to the monitor 12405 and displayed or supplied to the memory 12406 and stored (recorded).

When the above-described photoelectric conversion device is included in the range image sensor 12401 thus configured, for example, a more accurate range image can be obtained in association with improvement in the characteristics of the pixels.

Sixth Embodiment

Figure 13:
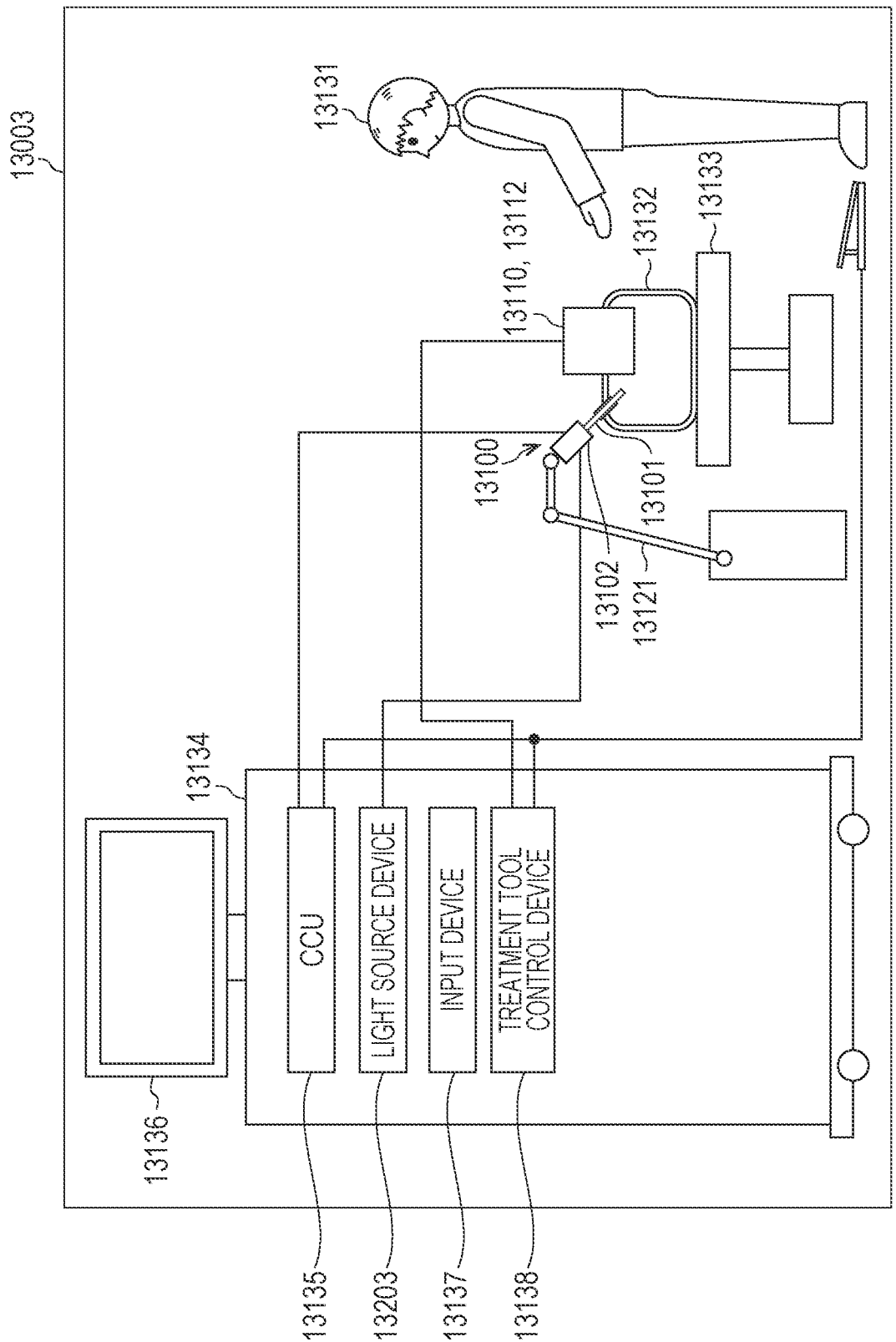
FIG. 13 is a functional block diagram of a photoelectric conversion system according to a sixth embodiment.

A photoelectric conversion system according to a sixth embodiment is a photoelectric conversion system including the photoelectric conversion device according to any one of the first to third embodiments. FIG. 13 illustrates an example configuration of an endoscopic surgery system that is an example photoelectric conversion system.

FIG. 13 illustrates a state where an operator (doctor) 13131 uses an endoscopic surgery system 13003 to perform an operation on a patient 13132 lying on a patient's bed 13133. As illustrated in FIG. 13, the endoscopic surgery system 13003 is constituted by an endoscope 13100, a surgery tool 13110, and a cart 13134 on which various devices for endoscopic surgeries are placed.

The endoscope 13100 is constituted by a lens barrel 13101 that is inserted into the body cavity of the patient 13132 in a region including the leading end thereof and having a predetermined length from the leading end, and a camera head 13102 that is connected to the base end of the lens barrel 13101. Although FIG. 13 illustrates an example where the endoscope 13100 is formed of a hard endoscope including the lens barrel 13101 that is a hard lens barrel, the endoscope 13100 may be formed of a soft endoscope including a soft lens barrel.

On the leading end of the lens barrel 13101, an opening in which an objective lens is fitted is provided. To the endoscope 13100, a light source device 13203 is connected, and light generated by the light source device 13203 is guided up to the leading end of the lens barrel 13101 through a light guide extending in the inside of the lens barrel 13101. This light is emitted toward an observation target in the body cavity of the patient 13132 through the objective lens. Note that the endoscope 13100 may be a direct-viewing endoscope, an oblique-viewing endoscope, or a side-viewing endoscope.

In the inside of the camera head 13102, an optical system and a photoelectric conversion device are provided, and reflected light (observation light) from the observation target is concentrated onto the photoelectric conversion device by the optical system. The observation light is subjected to photoelectric conversion by the photoelectric conversion device, and an electric signal corresponding to the observation light, that is, an image signal corresponding to an observation image, is generated. As the photoelectric conversion device, the photoelectric conversion device according to any of the above-described embodiments can be used. The image signal is transmitted to a camera control unit (CCU) 13135 as raw data.

The CCU 13135 is constituted by a central processing unit (CPU), a graphics processing unit (GPU), and so on and centrally controls operations of the endoscope 13100 and a display device 13136. Further, the CCU 13135 receives the image signal from the camera head 13102 and performs various types of image processing including a developing process (demosaicing process) for the image signal for displaying an image based on the image signal.

The display device 13136 displays the image based on the image signal for which image processing is performed by the CCU 13135, in accordance with control by the CCU 13135.

The light source device 13203 is formed of a light source, such as a light-emitting diode (LED), and supplies illumination light for capturing an image of, for example, a surgery part to the endoscope 13100.

An input device 13137 is an input interface for the endoscopic surgery system 13003. A user can input various types of information and input instructions to the endoscopic surgery system 13003 via the input device 13137.

A treatment tool control device 13138 controls driving of an energy treatment tool 13112 that is used to cauterize tissue, make an incision, or seal a blood vessel.

The light source device 13203 that supplies to the endoscope 13100 illumination light for capturing an image of a surgery part can be formed of a white light source that is formed of, for example, an LED, a laser light source, or a combination thereof. In a case where the white light source is formed of a combination of R, G, and B laser light sources, the output intensity and the output timing of each color (each wavelength) can be controlled with high precision, and therefore, the light source device 13203 can adjust white balance of a captured image. In this case, laser beams from the respective R, G, and B laser light sources can be emitted to an observation target in a time division manner, and driving of an imaging element of the camera head 13102 is controlled in synchronization with the emission timings. Accordingly, images corresponding to R, G, and B can be captured in a time division manner. With this method, color images can be obtained without providing a color filter to the imaging element.

Driving of the light source device 13203 may be controlled such that the intensity of output light is changed at predetermined time intervals. Driving of the imaging element of the camera head 13102 is controlled in synchronization with the timing when the light intensity is changed to thereby obtain images in a time division manner. When the images are combined, a high-dynamic-range image without blocked-up shadows or blown-out highlights can be generated.

The light source device 13203 may be configured to be capable of supplying light having a predetermined wavelength range corresponding to special-light observation. In special-light observation, for example, the wavelength dependence of light absorption into body tissue is used. Specifically, light in a band narrower than that of illumination light (that is, white light) for normal observation is emitted, and a high-contrast image of a predetermined tissue, such as a blood vessel on a mucous membrane surface, is captured. In special-light observation, fluorescent observation in which an image is obtained by using fluorescence generated in response to emission of excitation light may be performed. In fluorescent observation, for example, the following operations can be performed. Excitation light is emitted to a body tissue and fluorescence from the body tissue is observed, or a reagent, such as indocyanine green (ICG), is locally injected into a body tissue and excitation light corresponding to the fluorescence wavelength of the reagent is emitted to the body tissue to obtain a fluorescent image. The light source device 13203 can be configured to be capable of supplying a narrow-band light and/or excitation light corresponding to the special-light observation as described above.

Seventh Embodiment

Figure 14A:
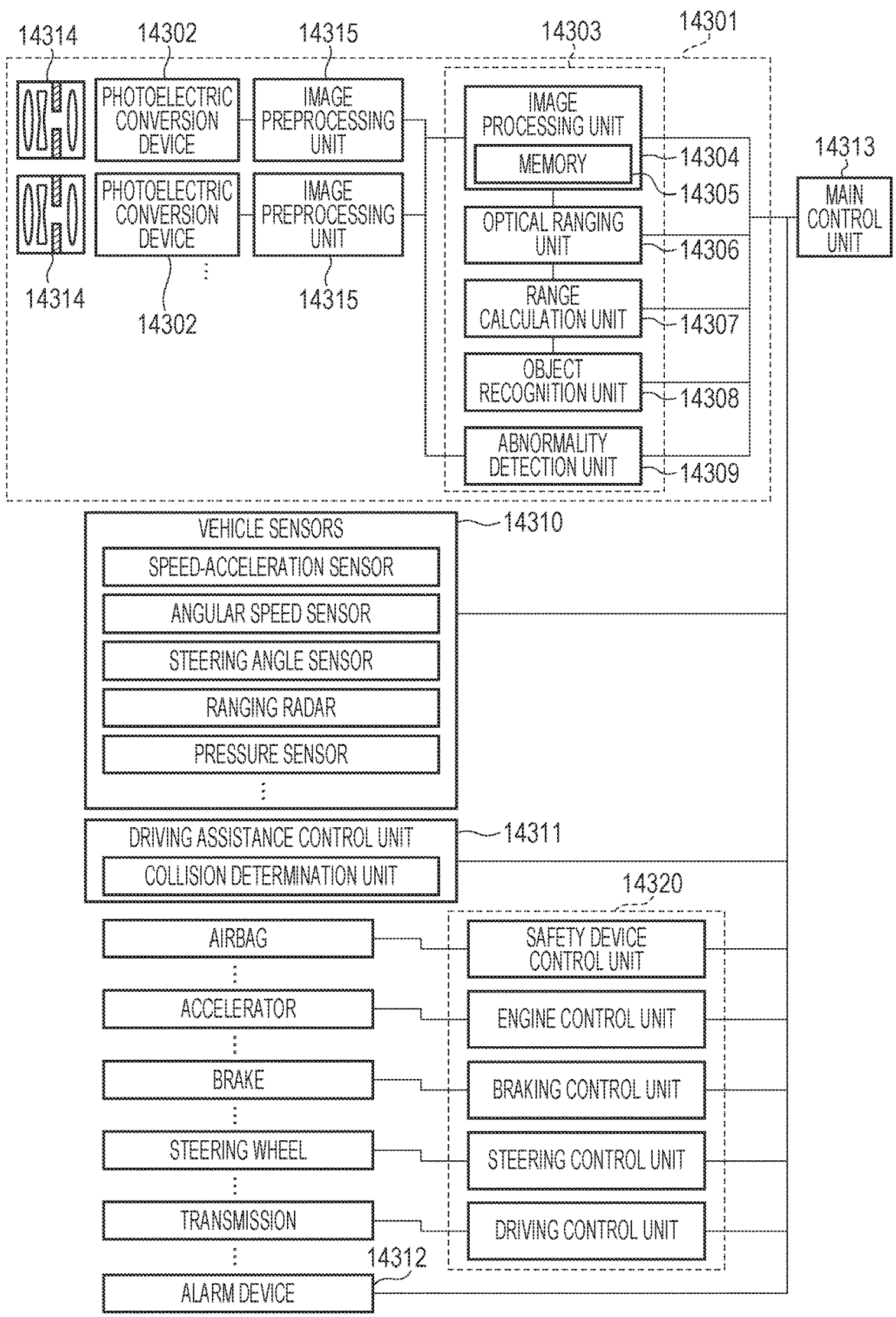
FIGS. 14A and 14B are diagrams of a photoelectric conversion system and a mobile body according to a seventh embodiment.
Figure 14B:
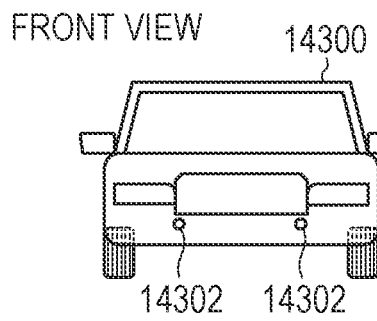
Figure 14B:
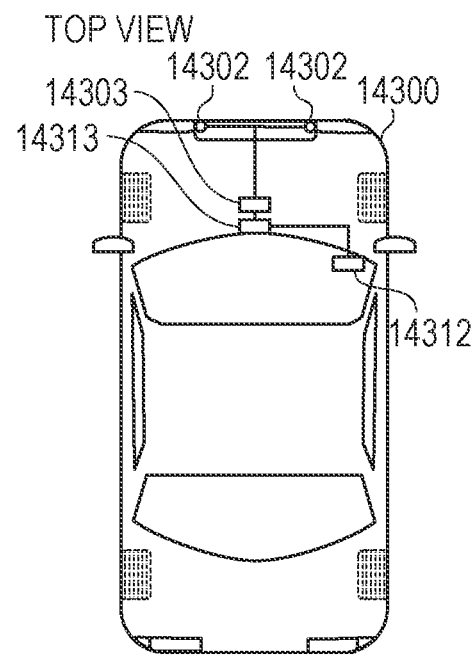
Figure 14B:
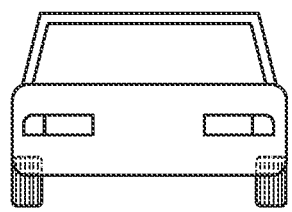

A photoelectric conversion system and a mobile body according to this embodiment will be described with reference to FIGS. 14A and 14B. FIGS. 14A and 14B are schematic diagrams illustrating an example configuration of the photoelectric conversion system and that of the mobile body according to this embodiment. In this embodiment, as the photoelectric conversion system, for example, an onboard camera will be described.

FIGS. 14A and 14B illustrate an example of a vehicle system and that of the photoelectric conversion system that is mounted in the vehicle system to perform image capturing. A photoelectric conversion system 14301 includes a photoelectric conversion device 14302, an image preprocessing unit 14315, an integrated circuit 14303, and an optical system 14314. The optical system 14314 forms an optical image of an object on the photoelectric conversion device 14302. The photoelectric conversion device 14302 converts the optical image of the object formed by the optical system 14314 to an electric signal. The photoelectric conversion device 14302 is the photoelectric conversion device according to any of the above-described embodiments. The image preprocessing unit 14315 performs predetermined signal processing for the signal output from the photoelectric conversion device 14302. The function of the image preprocessing unit 14315 may be integrated into the photoelectric conversion device 14302. The photoelectric conversion system 14301 includes at least two sets each including the optical system 14314, the photoelectric conversion device 14302, and the image preprocessing unit 14315, and an output from the image preprocessing unit 14315 in each set is input to the integrated circuit 14303.

The integrated circuit 14303 is an integrated circuit for use in an image capturing system and includes an image processing unit 14304 including a memory 14305, an optical ranging unit 14306, a range calculation unit 14307, an object recognition unit 14308, and an abnormality detection unit 14309. The image processing unit 14304 performs image processing including a developing process and defect correction for the output signal from the image preprocessing unit 14315. The memory 14305 temporarily stores a captured image and stores the position of a defective imaging pixel. The optical ranging unit 14306 places the focus on an object and measures the distance. The range calculation unit 14307 calculates range information from a plurality of pieces of image data obtained by the plurality of photoelectric conversion devices 14302. The object recognition unit 14308 recognizes objects, such as cars, roads, signs, and people. The abnormality detection unit 14309 issues an abnormality alarm to a main control unit 14313 when detecting an abnormality in the photoelectric conversion device 14302.

The integrated circuit 14303 may be implemented as specifically designed hardware, a software module, or a combination thereof. The integrated circuit 14303 may be formed of, for example, a field-programmable gate array (FPGA), an application-specific integrated circuit (ASIC), or a combination thereof.

The main control unit 14313 centrally controls operations of the photoelectric conversion system 14301, vehicle sensors 14310, control units 14320, and so on. A method (conforming to, for example, the Control Area Network (CAN) standard) in which the main control unit 14313 is not used and the photoelectric conversion system 14301, the vehicle sensors 14310, and the control units 14320 individually have communication interfaces and individually transmit and receive control signals via a communication network can be employed.

The integrated circuit 14303 has a function of transmitting a control signal and a set value to the photoelectric conversion device 14302 in response to a control signal from the main control unit 14313 or by a control unit included therein.

The photoelectric conversion system 14301 is connected to the vehicle sensors 14310 and can detect the traveling state of the vehicle including the vehicle speed, the yaw rate, and the steering angle, the state of the environment outside the vehicle, and the states of the other vehicles and obstacles. The vehicle sensors 14310 correspond to a distance information obtainer that obtains information about the distance to a target object. The photoelectric conversion system 14301 is connected to a driving assistance control unit 14311 that provides various driving assistances including an autonomous steering function, an autonomous traveling function, and a collision prevention function. Specifically, regarding a collision determination function, a collision with another vehicle or an obstacle is predicted and the occurrence of a collision is determined on the basis of the results of detection by the photoelectric conversion system 14301 and the vehicle sensors 14310. Accordingly, control for avoiding a predicted collision is performed and a safety device is activated at the time of collision.

The photoelectric conversion system 14301 is also connected to an alarm device 14312 that issues an alarm to the driver on the basis of the result of determination by a collision determination unit. For example, in a case where the possibility of a collision is considered to be high as a result of determination by the collision determination unit, the main control unit 14313 performs vehicle control to avoid the collision or reduce damage by, for example, applying the brakes, releasing the accelerator, or suppressing output of the engine.

The alarm device 14312 gives the user an alarm by, for example, sounding an alarm, displaying alarm information on a display screen of, for example, the car navigation system or the instrument panel, or sending a vibration to the seatbelt or the steering wheel.

In this embodiment, images of a scene around the vehicle, such as a scene in front of or behind the vehicle, are captured by the photoelectric conversion devices 14302. FIG. 14B illustrates example disposition of the photoelectric conversion devices 14302 in a case where images of a scene in front of the vehicle are captured by the photoelectric conversion devices 14302.

The two photoelectric conversion devices 14302 are disposed in the front part of a vehicle 14300. Specifically, the two photoelectric conversion devices 14302 are disposed axisymmetric about an axis of symmetry that is the center line in the back and forth directions or the center line of the external shape (for example, the vehicle width) of the vehicle 14300. With this form, information about the distance between the vehicle 14300 and a target object can be obtained and the possibility of a collision can be determined.

Further, the photoelectric conversion devices 14302 can be disposed so as not to enter the driver's field of view when the driver visually recognizes the circumstances outside the vehicle 14300 from the driver's seat. The alarm device 14312 can be disposed such that the alarm device 14312 is more likely to enter the driver's field of view.

In this embodiment, although control for preventing a collision with another vehicle has been described, the photoelectric conversion system 14301 is also applicable to control for autonomous driving by following another vehicle or control for autonomous driving so as not to deviate from the lane. The photoelectric conversion system 14301 is further applicable to not only vehicles including the vehicle 14300 but also other mobile bodies (mobile devices), such as vessels, aircrafts, or industrial robots. In addition, the photoelectric conversion system 14301 is applicable to not only mobile bodies but also a wide variety of devices, including an Intelligent Transport System (ITS), that perform object recognition.

The photoelectric conversion device according to this embodiment may be configured to be capable of obtaining various types of information including distance information.

Eighth Embodiment

Figure 15A:
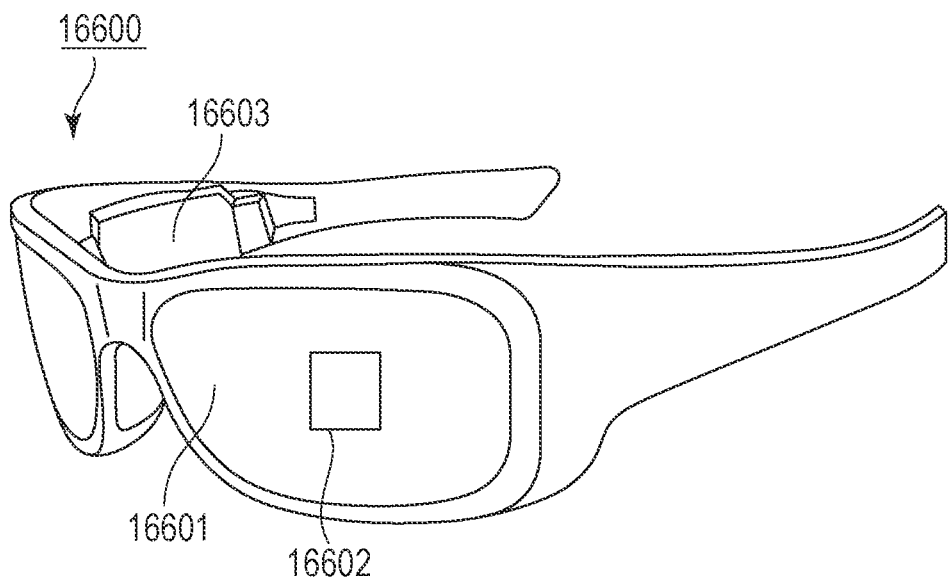
FIGS. 15A and 15B are schematic diagrams of a photoelectric conversion system according to an eighth embodiment.

FIG. 15A illustrates eyewear 16600 (smart eyeglasses) that is an example of a photoelectric conversion system according to this embodiment. The eyewear 16600 includes a photoelectric conversion device 16602. The photoelectric conversion device 16602 is the photoelectric conversion device according to any one of the first to third embodiments. On the back side of a lens 16601, a display device including a light-emitting device, such as an organic light-emitting diode (OLED) or an LED, may be provided. One photoelectric conversion device 16602 may be provided or a plurality of photoelectric conversion devices 16602 may be provided. A plurality of types of photoelectric conversion devices may be combined and used. The position at which the photoelectric conversion device 16602 is disposed need not be as illustrated in FIG. 15A.

The eyewear 16600 further includes a control device 16603. The control device 16603 functions as a power supply that supplies power to the photoelectric conversion device 16602 and to the display device described above. The control device 16603 controls operations of the photoelectric conversion device 16602 and the display device. The lens 16601 includes an optical system for concentrating light onto the photoelectric conversion device 16602.

Figure 15B:
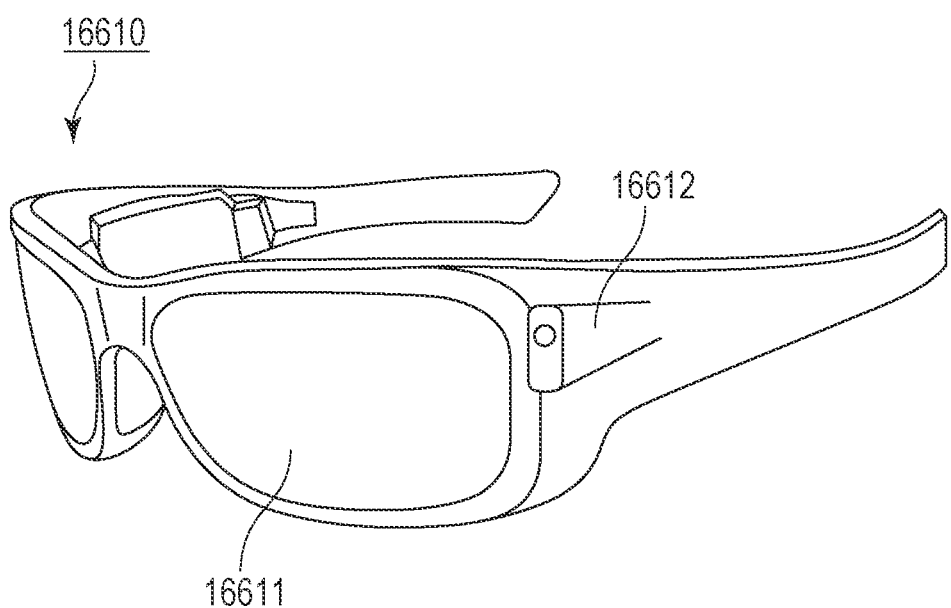

FIG. 15B illustrates eyewear 16610 (smart glasses) according to an example application.

The eyewear 16610 includes a control device 16612, and the control device 16612 includes a photoelectric conversion device corresponding to the photoelectric conversion device 16602 and a display device. A lens 16611 includes an optical system for projecting light emitted from the photoelectric conversion device and the display device in the control device 16612, and an image is projected onto the lens 16611. The control device 16612 functions as a power supply that supplies power to the photoelectric conversion device and the display device and controls operations of the photoelectric conversion device and the display device. The control device 16612 may include a line-of-sight detection unit that detects the wearer's line of sight. To detect the line of sight, infrared rays may be used. An infrared emission unit emits an infrared ray to the eyeball of the user who is gazing at a display image. When reflected light from the eyeball resulting from the emitted infrared ray is detected by an image capturing unit including a light receiving element, an image of the eyeball can be captured. When a unit for reducing light emitted from the infrared emission unit toward a display unit in plan view is provided, a decrease in image quality can be suppressed.

From the captured image of the eyeball obtained by image capturing using an infrared ray, the user's line of sight toward the display image is detected. To detect the line of sight using the captured image of the eyeball, any publicly known method can be used. For example, a line-of-sight detection method based on a Purkinje image obtained by using reflection of illumination light from the cornea can be used.

More specifically, a line-of-sight detection process based on the pupil and corneal reflection method is performed. The pupil and corneal reflection method is used, and a line-of-sight vector that indicates the orientation (angle of rotation) of the eyeball is calculated on the basis of an image of the pupil included in the captured image of the eyeball and the Purkinje image to thereby detect the user's line of sight.

The display device according to this embodiment may include a photoelectric conversion device including a light receiving element, and a display image of the display device may be controlled on the basis of line-of-sight information about the user from the photoelectric conversion device.

Specifically, for the display device, a first field-of-view region at which the user gazes and a second field-of-view region other than the first field-of-view region are determined on the basis of line-of-sight information. The first field-of-view region and the second field-of-view region may be determined by a control device of the display device or may be determined by an external control device. In the display region of the display device, the display resolution of the first field-of-view region may be controlled so as to be higher than the display resolution of the second field-of-view region. That is, the resolution of the second field-of-view region may be made lower than that of the first field-of-view region.

The display region may include a first display region and a second display region different from the first display region, and a region having a higher degree of priority may be determined from among the first display region and the second display region on the basis of line-of-sight information. The first display region and the second display region may be determined by the control device of the display device or may be determined by an external control device. The resolution of a region having a higher degree of priority may be controlled so as to be higher than the resolution of a region other than the region having a higher degree of priority. That is, the resolution of a region having a relatively low degree of priority may be decreased.

Artificial Intelligence (AI) may be used to determine the first field-of-view region and the region having a higher degree of priority. The AI may be a model configured to estimate the angle of the line of sight and the distance to a target object in the direction of the line of sight, from an image of the eyeball by using the image of the eyeball and the direction of actual viewing by the eyeball in the image, as teacher data. An AI program may be installed in the display device, in the photoelectric conversion device, or in an external device. In a case where the AI program is installed in the external device, the AI program is transmitted to the display device via communication.

In a case of display control based on visual recognition detection, this embodiment is applicable to smart glasses further including a photoelectric conversion device that captures an image of an external scene. The smart classes can display in real time, external information obtained by image capturing.

Ninth Embodiment

Figure 16:
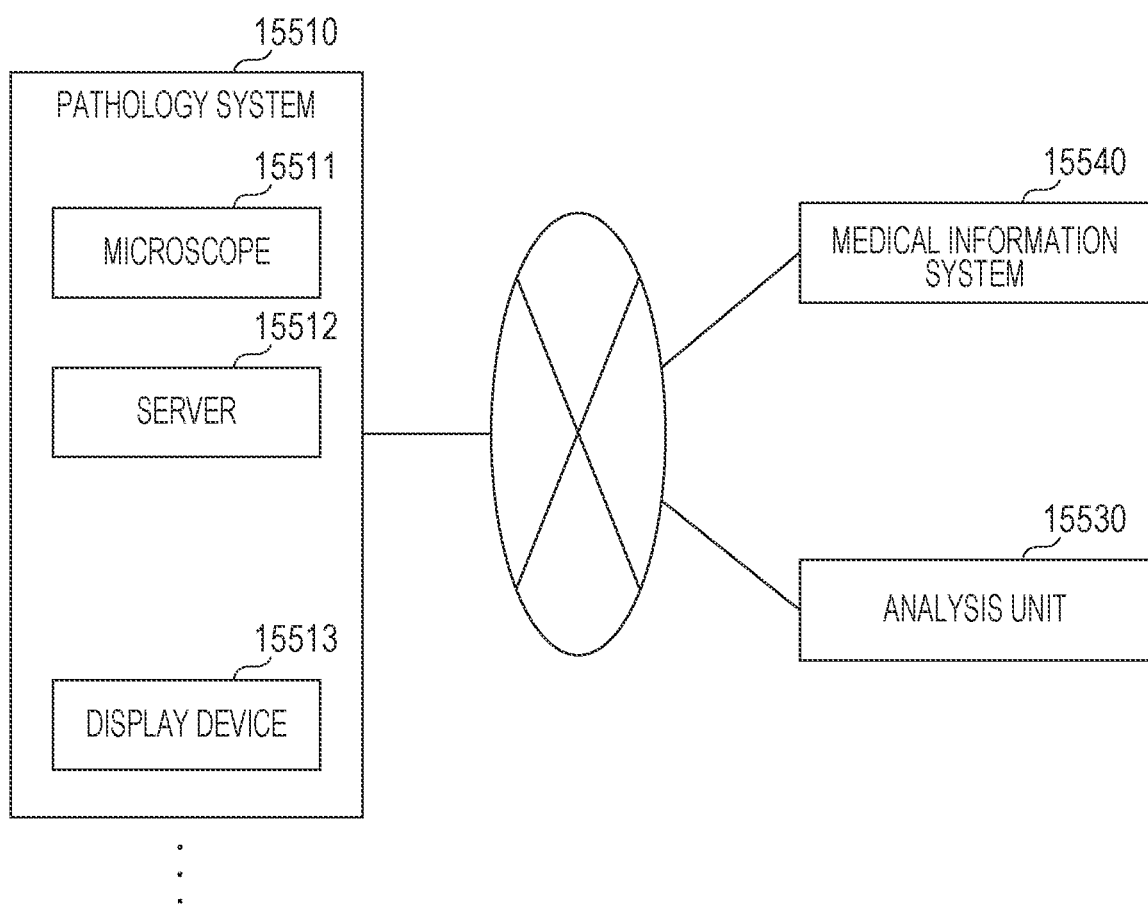
FIG. 16 is a functional block diagram of a photoelectric conversion system according to a ninth embodiment.

With reference to FIG. 16, a photoelectric conversion system according to this embodiment will be described. FIG. 16 illustrates a diagnosis support system that is an example photoelectric conversion system. The photoelectric conversion system is applicable to a pathological diagnosis system used by, for example, a doctor who observes cells or tissue collected from a patient and diagnoses a lesion and to a diagnosis support system that supports the pathological diagnosis system. The system according to this embodiment may be used to diagnose a lesion on the basis of an obtained image or support the diagnosis.

As illustrated in FIG. 16, the system according to this embodiment includes one more pathology systems 15510. The system may further include an analysis unit 15530 and a medical information system 15540.

Each of the one or more pathology systems 15510 is a system mainly used by a pathologist and is introduced in, for example, a laboratory or a hospital. The pathology systems 15510 may be introduced in different hospitals and connected to the analysis unit 15530 and to the medical information system 15540 via various networks including a wide area network and a local area network.

Each pathology system 15510 includes a microscope 15511, a server 15512, and a display device 15513.

The microscope 15511 has functions of an optical microscope and captures an image of an observation target placed on a glass slide to obtain a pathological image that is a digital image. Examples of the observation target include cells or tissue collected from a patient and may include an organ slice, saliva, and blood.

The server 15512 stores and saves the pathological image obtained by the microscope 15511 in a storage unit not illustrated. The server 15512 can retrieve a pathological image retained in, for example, a memory in response to acceptance of a viewing request and display the retrieved pathological image on the display device 15513. The server 15512 and the display device 15513 may be provided with, for example, a display control device interposed therebetween.

In a case where an observation target is solid matter, such as an organ slice, the observation target may be, for example, a stained thin section. The thin section may be obtained by, for example, slicing a block section cut from a sample of, for example, an organ. During slicing, the block section may be immobilized by, for example, paraffin.

The microscope 15511 can include a low-resolution image capturing unit for image capturing with a low resolution and a high-resolution image capturing unit for image capturing with a high resolution. The low-resolution image capturing unit and the high-resolution image capturing unit may be formed of different optical systems or the same optical system. In a case where the low-resolution image capturing unit and the high-resolution image capturing unit are formed of the same optical system, the resolution of the microscope 15511 may be changed in accordance with an image capture target.

An observation target is placed on, for example, a glass slide and mounted on a stage that is positioned within the angle of view of the microscope 15511. The microscope 15511 obtains an overall image in the angle of view with the low-resolution image capturing unit and identifies the region of the observation target from the obtained overall image. Subsequently, the microscope 15511 divides the region in which the observation target is present into a plurality of sub-regions having a predetermined size and successively captures images of the sub-regions with the high-resolution image capturing unit to thereby obtain high-resolution images of the sub-regions. To switch the target sub-region, the stage may be moved, an imaging optical system may be moved, or both the stage and the imaging optical system may be moved. The sub-regions adjacent to each other may overlap so as to prevent, for example, a sub-region from being omitted from image capturing due to unintended sliding of the glass slide. The overall image may include identification information for associating the overall image with the patient. The identification information may be, for example, a character string or a QR code (registered trademark).

The high-resolution images obtained by the microscope 15511 are input to the server 15512. The server 15512 can divide each high-resolution image into partial images having a smaller size. After generating the partial images as described above, the server 15512 performs, for all partial images, a combining process of combining a predetermined number of partial images adjacent to each other to generate one image. This combining process can be repeated until one partial image is generated in the end. With such a process, a group of partial images having a pyramidal structure in which each of the layers includes one or more partial images is generated. In this pyramidal structure, the number of pixels of a partial image in a certain layer and the number of pixels of a partial image in a layer different from the certain layer are the same but the resolutions of the partial images are different. For example, when 2×2 partial images, that is, four partial images in total, are combined to generate one partial image in a higher layer, the resolution of the partial image in the higher layer is one-half of the resolution of the combined partial images in the lower layer.

When the group of partial images having the pyramidal structure is created, the level of detail of the observation target displayed on the display device 15513 can be switched in accordance with the layer to which the display target tile image belongs. For example, in a case where a partial image in the lowest layer is used, a narrow region of the observation target can be displayed in detail. In a case where a partial image in a higher layer is used, a wider region of the observation target can be roughly displayed.

The generated group of partial images having the pyramidal structure can be, for example, stored in a memory or the like. In response to acceptance of a partial-image obtaining request including identification information from another device (for example, the analysis unit 15530), the server 15512 transmits a partial image corresponding to the identification information to the other device.

Note that partial images that are pathological images may be generated for each of the image capture conditions including the focal length and the staining condition. In a case where partial images are generated for each image capture condition, a specific pathological image and another pathological image that corresponds to an image capture condition different from a specific image capture condition and that is an image of a region the same as the region of the specific pathological image may be displayed side by side. The specific image capture condition may be specified by the viewer. In a case where the viewer specifies a plurality of image capture conditions, pathological images, of the same region, corresponding to the respective image capture conditions may be displayed side by side.

The server 15512 may store the group of partial images having the pyramidal structure in a storage device other than the server 15512, that is, for example, a cloud server. Further, the process for generating partial images as described above may be performed in part or in whole by, for example, a cloud server. When partial images are used as described above, the user can feel as if the user is observing the observation target while changing the observation magnification. That is, by controlling display, functions of, for example, a virtual microscope can be implemented. The virtual observation magnification actually corresponds to the resolution.

The medical information system 15540 is an electronic health record system and stores information for identifying patients, disease information about patients, examination information and image information used in diagnoses, the results of diagnoses, and information regarding diagnoses including prescribed drugs. For example, a pathological image obtained by capturing an image of an observation target of a certain patient can be saved on the server 15512 and subsequently displayed on the display device 15513. A pathologist who uses the pathology system 15510 makes a pathological diagnosis on the basis of the pathological image displayed on the display device 15513. The result of pathological diagnosis made by the pathologist is stored on the medical information system 15540.

The analysis unit 15530 can make an analysis on a pathological image. In this analysis, a learning model created by machine learning can be used. The analysis unit 15530 may derive, for example, the result of classification of a specific region or the result of identification of tissue as the result of analysis. Further, the analysis unit 15530 may derive, for example, the results of identification including cell information, the count, the position, and brightness information and scoring information about the results of identification. These pieces of information obtained by the analysis unit 15530 may be displayed on the display device 15513 of the pathology system 15510 as diagnosis support information.

Note that the analysis unit 15530 may be a server system constituted by, for example, one or more servers (including a cloud server). The analysis unit 15530 may be integrated into, for example, the server 15512 in the pathology system 15510. That is, various analyses on pathological images may be made within the pathology system 15510.

The photoelectric conversion device described in any of the first to third embodiments is applicable to, for example, the microscope 15511 in the configuration described above. Specifically, the photoelectric conversion device described in any of the first to third embodiments is applicable to the low-resolution image capturing unit and/or the high-resolution image capturing unit in the microscope 15511. Accordingly, the sizes of the low-resolution image capturing unit and/or the high-resolution image capturing unit can be reduced, and accordingly, the size of the microscope 15511 can be reduced. Accordingly, the microscope 15511 can be easily carried and, for example, system introduction or system reconfiguration can be facilitated. Further, when the photoelectric conversion device described in any of the above-described embodiments is applied, the process from obtaining of a pathological image to an analysis of the pathological image can be performed on-the-fly in part or in whole within the microscope 15511, and therefore, diagnosis support information can be output more quickly and appropriately.

The configuration described above is applicable to not only the diagnosis support system but also general biological microscopes including a confocal microscope, a fluorescent microscope, and a video microscope. The observation target may be a biological sample such as cultured cells, a fertilized egg, or spermatozoa, biomaterial such as a cell sheet or a three-dimensional cell tissue, or a biological body such as zebrafish or a mouse. The observation target can be observed in a state where the observation target is placed in a well plate or a petri dish instead of a glass slide.

A moving image may be generated from still images of an observation target captured by using the microscope. For example, a moving image may be generated from still images successively captured for a predetermined period, or a sequence of images may be generated from still images captured at predetermined intervals. When a moving image is thus generated from still images, dynamic characteristics of the observation target, such as beats, extension, and movement including migration of cancer cells, nerve cells, cardiac muscle tissue, spermatozoa, and so on, or a process of division of cultured cells or a fertilized egg, can be analyzed by using machine learning.

Modifications of Embodiments

The disclosure is not limited to the above-described embodiments and various modifications can be made. For example, an example where part of the configuration of any of the embodiments is added to another embodiment and an example where part of the configuration of any of the embodiments is replaced by part of the configuration of another embodiment are included in embodiments of the disclosure. Note that all of the above-described embodiments only illustrate specific examples of embodiments of the disclosure and should not be used to interpret the technical scope of the disclosure in a limited manner. That is, the disclosure can be embodied without departing from the technical spirit thereof or major features thereof.

Accordingly, it is possible to provide a photoelectric conversion device with which control signals can be generated at an increased speed and a signal processing result that is less likely to cause a decrease in the SN ratio can be obtained.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

What is claimed is:

1. A photoelectric conversion device comprising:
    a first substrate including a pixel array that includes a plurality of pixels arranged in rows and columns and each including a photoelectric conversion element, and a plurality of output lines each configured to connect to pixels arranged in corresponding one column of the columns;
    a second substrate including a first signal processing unit configured to generate a processed signal by processing a first signal output from the pixel array, the second substrate being stacked together with the first substrate;
    a plurality of connection parts each configured to be a transmission between the first substrate and the second substrate,
    wherein a second signal output from the pixel array is output to a second signal processing unit disposed at a position different from a position at which the first signal processing unit is disposed,
    and a first path through which the first signal from the pixel array is output to the first signal processing unit is different from a second path through which the second signal from the pixel array is output to the second signal processing unit,
    wherein the first path includes a first connection part of the plurality of connection parts, and the second path includes a second connection part of the plurality of connection parts, the second connection part being connected to one of the plurality of output lines,
    and one pixel of the plurality of pixels includes a plurality of photoelectric conversion elements.

2. The photoelectric conversion device according to claim 1, wherein one micro-lens is arranged corresponding to the plurality of photoelectric conversion elements in the one pixel.

3. The photoelectric conversion device according to claim 2, wherein one of the first path and the second path transmits a signal output from the one pixel generated by charge of one of the plurality of photoelectric conversion elements.

4. The photoelectric conversion device according to claim 3, wherein the signal is used in phase difference detection.

5. The photoelectric conversion device according to claim 3, wherein the signal is used in phase difference detection.

6. The photoelectric conversion device according to claim 1, wherein an operation of the one pixel is controlled by the first signal processing unit based on the processed signal.

7. The photoelectric conversion device according to claim 1, wherein, in a plan view, the first connection part is arranged in an area of the pixel array.

8. The photoelectric conversion device according to claim 7, wherein in the plan view, the first signal processing unit is arranged in the area of the pixel array.

9. The photoelectric conversion device according to claim 1, wherein the pixel array includes pixel blocks obtained by grouping the plurality of pixels into blocks each including pixels, and the first connection part is connected to pixels constituting one of the pixel blocks in common.

10. The photoelectric conversion device according to claim 9, wherein the first connection part is configured to transmit the first signal output from one of the pixels in the one of the pixel blocks, and the first signal output from another one of the pixels in the one of the pixel blocks.

11. The photoelectric conversion device according to claim 9, further including a plurality of first connection parts each being the first connection part,
    wherein each of the plurality of first connection parts is arranged in an area of corresponding one of the pixel blocks.

12. The photoelectric conversion device according to claim 11, wherein in the plan view, each of the plurality of first connection parts is arranged in the area of the pixel array, and each of the plurality of first connection parts is arranged in a corresponding one of a plurality of rows and a corresponding one of a plurality of columns.

13. The photoelectric conversion device according to claim 9, wherein in the plan view, in each of the pixel blocks, at least part of the first signal processing unit and the first connection part are arranged in an area of the one of the pixel blocks.

14. The photoelectric conversion device according to claim 11, wherein in the plan view, at least part of the first signal processing unit and the first connection part are arranged in an area of the one of the pixel blocks.

15. The photoelectric conversion device according to claim 12, wherein in the plan view, in each of the pixel blocks, at least part of the first signal processing unit and the first connection part are arranged in an area of the one of the pixel blocks.

16. The photoelectric conversion device according to claim 9, wherein in the plan view, at least part of an area of the one of the pixel blocks and the first connection part are arranged in an area of the first signal processing unit.

17. The photoelectric conversion device according to claim 12, wherein in the plan view, at least part of an area of the one of the pixel blocks and the first connection part are arranged in an area of the first signal processing unit.

18. The photoelectric conversion device according to claim 13, wherein in the plan view, in each of the pixel blocks, at least part of an area of the one of the pixel blocks and the first connection part are arranged in an area of the first signal processing unit.

19. The photoelectric conversion device according to claim 9, wherein, in each of the pixel blocks, the pixels are arranged in a plurality of rows and a plurality of columns.

20. The photoelectric conversion device according to claim 11, wherein, in each of the pixel blocks, the pixels are arranged in a plurality of rows and a plurality of columns.

21. The photoelectric conversion device according to claim 7, wherein in the plan view, the second connection part is arranged in an outside of the area of the pixel array.

22. The photoelectric conversion device according to claim 9, wherein in the plan view, the second connection part is arranged in an outside of the area of the pixel array.

23. The photoelectric conversion device according to claim 11, wherein in the plan view, the second connection part is arranged in an outside of the area of the pixel array.

24. The photoelectric conversion device according to claim 21, wherein in the plan view, no pixel configured to receive an incident light is arranged in an area of the second connection part.

25. The photoelectric conversion device according to claim 1, further including a plurality of first connection parts each being the first connection part,
    wherein the plurality of first connection parts is connected to pixels in at least a first column of the columns of the pixel array, and
    wherein the one of the plurality of output lines connected to the second connection part, is connected to pixels in the first column.

26. The photoelectric conversion device according to claim 25, wherein a number of the plurality of first connection parts is larger than a number of the second connection part.

27. The photoelectric conversion device according to claim 1, further including a plurality of first connection parts each being the first connection part and a plurality of second connection parts each being the second connection part,
wherein a number of all of the plurality of first connection parts in the photoelectric conversion device is larger than a number of all of the plurality of the second connection parts in the photoelectric conversion device.

28. The photoelectric conversion device according to claim 1, wherein the second signal processing unit includes an analog-digital conversion circuit configured to convert the second signal into a digital signal.

29. The photoelectric conversion device according to claim 9, wherein the second signal processing unit includes an analog-digital conversion circuit configured to convert the second signal into a digital signal.

30. The photoelectric conversion device according to claim 11, wherein the second signal processing unit includes an analog-digital conversion circuit configured to convert the second signal into a digital signal.

31. The photoelectric conversion device according to claim 1, wherein the second substrate includes the second signal processing unit.

32. The photoelectric conversion device according to claim 1, wherein the second substrate includes a first control unit configured to control the second signal processing unit.

33. The photoelectric conversion device according to claim 32, wherein the second signal processing unit includes an analog-digital conversion circuit configured to convert the second signal into a digital signal, and the first control unit is configured to control an analog-digital conversion gain of the analog-digital conversion circuit in processing by the second signal processing unit.

34. The photoelectric conversion device according to claim 1, wherein the second substrate includes a first control unit, a pixel of the plurality of pixels includes a floating diffusion region, and the first control unit is configured to switch a capacitance value of the floating diffusion region of the pixel.

35. The photoelectric conversion device according to claim 1, wherein the second substrate includes a first control unit, the first control unit is configured to control at least either a pixel of the plurality of pixels or the second signal processing unit before the second signal processing unit starts signal processing for the signal from the pixel.

36. The photoelectric conversion device according to claim 1, wherein a pixel of the plurality of pixels has a first mode in which a reverse bias voltage that causes avalanche multiplication in the photoelectric conversion element is supplied and a second mode in which a voltage that does not cause avalanche multiplication is supplied.

37. The photoelectric conversion device according to claim 1, wherein the first substrate includes a first insulating layer, and the second substrate includes a second insulating layer, each of first parts of the plurality of connection parts includes a metal member disposed in the first insulating layer, each of second parts of the plurality of connection parts includes a metal member disposed in the second insulating layer, and one of the first parts of the plurality of connection parts and one of the second parts of the plurality of connection parts are bonded together.

38. The photoelectric conversion device according to claim 1, wherein a first digital signal is generated by the first signal processing unit, and a second digital signal is generated by the second signal processing unit, and a number of a bit or bits of the first digital signal is different from a number of a bit or bits of the second digital signal.

39. The photoelectric conversion device according to claim 38, wherein the number of a bit or bits of the first digital signal is smaller than the number of bits of the second digital signal.

40. The photoelectric conversion device according to claim 1, wherein the first signal processing unit generates a digital signal having only one-bit signal based on the first signal.

41. The photoelectric conversion device according to claim 1, wherein the first signal processing unit determines whether a signal level of the first signal is larger or smaller than a specific reference voltage.

42. A photoelectric conversion system comprising:
the photoelectric conversion device according to claim 1; and
a signal processing unit configured to process a signal output from the photoelectric conversion device.

* * * * *